United States Patent
Yamamoto et al.

(10) Patent No.: US 10,584,202 B2
(45) Date of Patent: Mar. 10, 2020

(54) PHOTOVOLTAIC ELEMENT

(71) Applicant: Toray Industries, Inc., Tokyo (JP)

(72) Inventors: Shuhei Yamamoto, Otsu (JP); Satoru Shimomura, Otsu (JP); Daisuke Kitazawa, Otsu (JP)

(73) Assignee: Toray Industries, Inc, Tokyo (JP)

(*) Notice: Subject to any disclaimer, the term of this patent is extended or adjusted under 35 U.S.C. 154(b) by 6 days.

(21) Appl. No.: 15/303,323

(22) PCT Filed: Apr. 7, 2015

(86) PCT No.: PCT/JP2015/060802
§ 371 (c)(1),
(2) Date: Oct. 11, 2016

(87) PCT Pub. No.: WO2015/159755
PCT Pub. Date: Oct. 22, 2015

(65) Prior Publication Data
US 2017/0033304 A1 Feb. 2, 2017

(30) Foreign Application Priority Data
Apr. 14, 2014 (JP) ................. 2014-082492

(51) Int. Cl.
*C08G 61/12* (2006.01)
*H01L 51/42* (2006.01)
*H01L 51/00* (2006.01)

(52) U.S. Cl.
CPC ........ *C08G 61/126* (2013.01); *H01L 51/4273* (2013.01); *C08G 2261/124* (2013.01);
(Continued)

(58) Field of Classification Search
CPC ... H01L 51/4213–4233; H01L 51/4246; H01L 51/4273
See application file for complete search history.

(56) References Cited

U.S. PATENT DOCUMENTS

2005/0191231 A1* 9/2005 Sun ........................... C09C 1/24
423/632
2008/0160306 A1* 7/2008 Mushtaq ............... C01B 25/082
428/402
(Continued)

FOREIGN PATENT DOCUMENTS

JP 2007-173516 A 7/2007
JP 2012-191194 A 10/2012
(Continued)

OTHER PUBLICATIONS

English Translation of the Written Opinion for PCT/JP2015/060802, dated May 26, 2015.*
(Continued)

*Primary Examiner* — William E McClain
(74) *Attorney, Agent, or Firm* — DLA Piper LLP (US)

(57) ABSTRACT

A photovoltaic element has excellent durability owing to an electron extraction layer in which an inorganic compound and an electron-donating group are more firmly bonded to each other, and includes at least a cathode, an electron extraction layer, a photoelectric conversion layer and an anode in this order, the electron extraction layer containing an inorganic compound (A), and an organic compound (B) having an electron-donating group and a bonding group, the electron extraction layer having an inorganic/organic hybrid structure in which the inorganic compound (A) and at least a part of the organic compound (B) are bonded to each other via the bonding group.

15 Claims, 1 Drawing Sheet

(52) U.S. Cl.
CPC . *C08G 2261/1412* (2013.01); *C08G 2261/18* (2013.01); *C08G 2261/312* (2013.01); *C08G 2261/3142* (2013.01); *C08G 2261/3223* (2013.01); *C08G 2261/3241* (2013.01); *C08G 2261/3243* (2013.01); *C08G 2261/91* (2013.01); *H01L 51/0036* (2013.01); *H01L 51/0043* (2013.01); *H01L 51/0047* (2013.01); *H01L 2251/303* (2013.01); *Y02E 10/549* (2013.01)

(56) References Cited

U.S. PATENT DOCUMENTS

| | | | |
|---|---|---|---|
| 2008/0290936 A1* | 11/2008 | Jun | C09K 11/025 327/603 |
| 2014/0150868 A1 | 6/2014 | Ichibayashi et al. | |
| 2014/0174512 A1 | 6/2014 | Kuwabara et al. | |
| 2015/0122334 A1* | 5/2015 | Otsubo | H01L 21/02422 136/263 |
| 2017/0141389 A1* | 5/2017 | Johnson | H01M 4/483 |

FOREIGN PATENT DOCUMENTS

| | | |
|---|---|---|
| JP | 2012-216832 A | 11/2012 |
| JP | 2013-55125 A | 3/2013 |
| JP | 2013-58714 A | 3/2013 |
| JP | 5298308 B2 | 9/2013 |
| WO | WO-2013180230 A1 * | 12/2013 |

OTHER PUBLICATIONS

Hau, et al. "Interfacial modification to improve inverted polymer solar cells." Journal of Materials Chemistry 18.42 (2008): 5113-5119.*

Ha, et al. "Inverted type polymer solar cells with self-assembled monolayer treated ZnO." The Journal of Physical Chemistry C 117.6 (2013): 2646-2652.*

Luck, et al. "Improved uniformity in high-performance organic photovoltaics enabled by (3-aminopropyl) triethoxysilane cathode functionalization." Physical Chemistry Chemical Physics 15.48 (2013): 20966-20972.*

Costenaro, et al. "Preparation of luminescent ZnO nanoparticles modified with aminopropyltriethoxy silane for optoelectronic applications." New Journal of Chemistry 37.7 (2013): 2103-2109.*

Zhang, et al. "The improved performance of dye sensitized solar cells by bifunctional aminosilane modified dye sensitized photoanode." Journal of Renewable and Sustainable Energy 2.1 (2010): 013104.*

Kotecha, et al. "NMR investigations of silane-coated nano-sized ZnO particles." Microporous and mesoporous materials 95.1-3 (2006): 66-75.*

Guerrero, et al. "Phosphonate coupling molecules for the control of surface/interface properties and the synthesis of nanonnaterials." Dalton Transactions 42.35 (2013): 12569-12585.*

Cassagneau, et al. "Optical and electrical characterizations of ultrathin films self-assembled from 11-aminoundecanoic acid capped TiO2 nanoparticles and polyallylamine hydrochloride." Langmuir 16.1 (2000): 241-246.*

Ulman. "Formation and structure of self-assembled monolayers." Chemical reviews 96.4 (1996): 1533-1554.*

Wang, et al. "Morphology and Amine Accessibility of (3-Aminopropyl) Triethoxysilane Films on Glass Surfaces." Scanning: The Journal of Scanning Microscopies 30.2 (2008): 65-77.*

Liu, et al. "Printable highly conductive conjugated polymer sensitized ZnO NCs as cathode interfacial layer for efficient polymer solar cells." ACS applied materials & interfaces 6.11 (2014): 8237-8245.*

Mutin, et al. "Hybrid materials from organophosphorus coupling molecules." Journal of Materials Chemistry 15.35-36 (2005): 3761-3768.*

Wei, et al. "Silane-capped ZnO nanoparticles for use as the electron transport layer in inverted organic solar cells." ACS nano 12.6 (2018): 5518-5529.*

B. R. Lee et al., "Amine-Based Polar Solvent Treatment for Highly Efficient Inverted Polymer Solar Cells", *Advanced Materials*, 2014, vol. 26, pp. 494-500.

J. Y. Kim et al., "New Architecture for High-Efficiency Polymer Photovoltaic Cells Using Solution-Based Titanium Oxide as an Optical Spacer", *Advanced Materials*, 2006, vol. 18, pp. 572-576.

Y. Liang et al., "Highly Efficient Solar Cell Polymers Developed via Fine-Tuning of Structural and Electronic Properties", *Journal of the American Chemical Society*, 2009, vol. 131, pp. 7792-7799.

L. Huo et al., "Replacing Alkoxy Groups with Alkylthienyl Groups: A Feasible Approach to Improve the Properties of Photovoltaic Polymers", *Angewandte Chemie*, 2011, vol. 123, pp. 9871-9876.

Z. Wu et al., "Enhanced performance of polymer solar cell with ZnO nanoparticle electron transporting layer passivated by in situ cross-linked three-dimensional polymer network", *Nanatechnology*, 2013, vol. 24, No. 48, pp. 484012, Abstract only.

Xavier Bulliard et al., "Enhanced Performance in Polymer Solar Cells by Surface Energy Control," *Advanced Functional Materials*, 2010, vol. 20, pp. 4381-4387.

Extended European Search Report dated Oct. 23, 2017, from corresponding European Application No. 15779593.1.

* cited by examiner

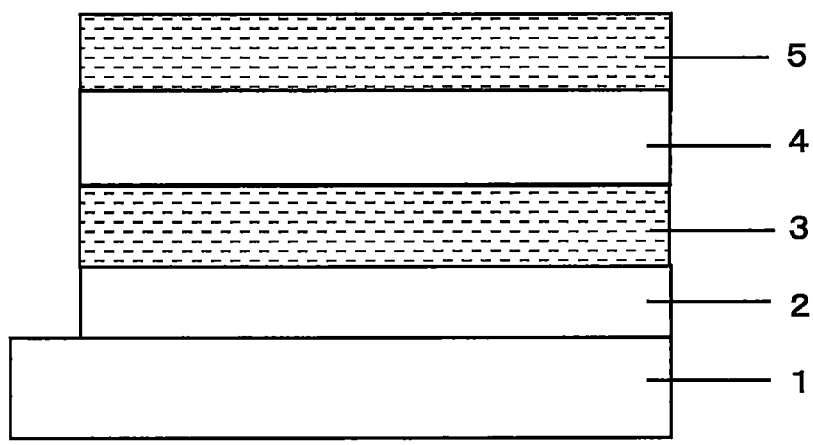

PHOTOVOLTAIC ELEMENT

TECHNICAL FIELD

This disclosure relates to a photovoltaic element.

BACKGROUND

Solar cells attract attention as a powerful environmentally friendly energy source as the energy issue is currently increasingly serious. Currently, inorganic substances such as single crystal silicon, polycrystal silicon, amorphous silicon and compound semiconductors are used as semiconductor materials for photovoltaic elements in solar cells. However, solar cells produced using an inorganic semiconductor have not become widespread in ordinary households yet because they have a higher cost compared to power generation systems such as thermal power generation. The factor of the high cost is mainly the process of forming a semiconductor thin-film under vacuum and a high temperature. Thus, organic solar cells produced using an organic semiconductor such as a conjugated polymer or an organic crystal, or an organic pigment, as a semiconductor material expected to ensure simplification of the production process are being studied. In those organic solar cells, a semiconductor material can be prepared by a coating method and, therefore, the production process can be considerably simplified.

However, organic solar cells produced using a conjugated polymer or the like have not been put into practical use yet because they have lower photoelectric conversion efficiency and durability compared to conventional solar cells produced using an inorganic semiconductor. To put organic solar cells into practical use, it is absolutely necessary to increase durability so that high photoelectric conversion efficiency is maintained for a long period of time.

As one method of improving photoelectric conversion efficiency and durability of an organic solar cell, an electron extraction layer is placed between a power generation layer and a cathode. As an electron extraction layer, for example, one including titanium oxide (Japanese Patent No. 05298308) or zinc oxide (National Publication of International Patent Application No. 2013-55125) has been reported.

In addition, it is disclosed that by applying an ethanolamine solution onto a zinc oxide layer that is an electron extraction layer, the surface energy level is adjusted to improve photoelectric conversion efficiency ("Advanced Materials", 2014, Vol. 26, pages 494-500).

We believed that an electron extraction layer including an inorganic oxide in combination with an electron-donating compound, typically an amine-based material, is effective in improving photoelectric conversion efficiency. However, in an element configuration using an electron extraction layer including zinc oxide in combination with an ethanolamine solution as disclosed in "Advanced Materials", 2014, Vol. 26, pages 494-500, the surface energy level on zinc oxide is adjusted to stabilize the interface state and, therefore, an element is driven with high photoelectric conversion efficiency immediately after preparation of the element, but photoelectric conversion efficiency is gradually reduced due to accumulation of thermal loads. In other words, the photovoltaic element described in "Advanced Materials", 2014, Vol. 26, pages 494-500 does not have sufficient heat stability although the photovoltaic element exhibits higher heat stability compared to a photovoltaic element produced using zinc oxide alone as an electron extraction layer.

It could therefore be helpful to provide a photovoltaic element having high photoelectric conversion efficiency, and excellent heat stability and durability.

SUMMARY

We believed that the low heat stability in the technique in "Advanced Materials", 2014, Vol. 26, pages 494-500 is ascribable to a bond between zinc oxide and ethanol amine, which consists of only a hydrogen bond, and is thus weak, resulting in liberation of ethanolamine and the like, and an electron extraction layer in which an inorganic compound and an electron-donating group are more firmly bonded to each other is necessary.

By providing an electron extraction layer in which an inorganic compound and an electron-donating group are bonded to each other by a silyl group or the like, liberation of the electron-donating group or the like is suppressed to improve the heat stability of the electron extraction layer so that a photovoltaic element having excellent durability is obtained.

We thus provide a photovoltaic element including at least a cathode, an electron extraction layer, a photoelectric conversion layer and an anode in this order, the electron extraction layer containing an inorganic compound (A), and an organic compound (B) having an electron-donating group and a bonding group, the photovoltaic element having an inorganic/organic hybrid structure in which the inorganic compound (A) and at least a part of the organic compound (B) are bonded to each other via the bonding group.

It is thus possible to provide a photovoltaic element having high photoelectric conversion efficiency and excellent durability.

BRIEF DESCRIPTION OF THE DRAWING

FIG. 1 is a sectional view showing one example of a photovoltaic.

DESCRIPTION OF REFERENCE SIGNS

1: Substrate
2: Cathode
3: Electron extraction layer
4: Photoelectric conversion efficiency
5: Anode

DETAILED DESCRIPTION

A photovoltaic element will be described. FIG. 1 is a sectional view showing one example of a photovoltaic element. The photovoltaic element in FIG. 1 includes a cathode 2, an electron extraction layer 3, a photoelectric conversion layer 4 and an anode 5 in this order on a substrate 1.

The substrate 1 is a substrate on which an electrode material and an organic semiconductor layer can be laminated according to the type and use of a photoelectric conversion material and, for example, a film or plate prepared by any method from inorganic materials such as non-alkali glass, quartz glass, aluminum, iron, copper and alloys such as stainless steel, or organic materials such as polyester, polycarbonate, polyolefins, polyamide, polyimide, polyphenylene sulfide, poly-para-xylene polymethyl methacrylate, epoxy resins and fluorine-based resins can be used as the substrate 1. When light is made incident from the substrate side, it is preferable that the substrate described above has a light transmissivity of about 80%.

As materials of the electrodes (cathode 2 and anode 5), metals such as gold, platinum, silver, copper, iron, zinc, tin, aluminum, indium, chromium, nickel, cobalt, scandium, vanadium, yttrium, cerium, samarium, europium, terbium, ytterbium, molybdenum, tungsten and titanium, metal oxides, composite metal oxides (indium tin oxide (ITO), indium zinc oxide (IZO), aluminum zinc oxide (AZO), gallium zinc oxide (GZO) and the like), and alkali metals and alkali earth metals (lithium, magnesium, sodium, potassium, calcium, strontium and barium) are preferably used. Further, electrodes composed of an alloy of the above-mentioned metals, or a laminated body of the above-mentioned metals are also preferably used. Electrodes including graphite, graphite interlayer compounds, carbon nanotubes, graphene, polyaniline and derivatives thereof, and polythiophene and derivatives thereof are preferably used. The electrode material may be a mixed layer or a laminated structure composed of two or more materials.

The electrically conductive material to be used in the anode 5 is preferably one that forms an ohmic junction with the photoelectric conversion layer 4. Further, when a hole transport layer as described later is used, the electrically conductive material to be used in the anode 5 is preferably one that forms an ohmic junction with the hole transport layer. The electrically conductive material to be used in the cathode 2 is preferably one that forms an ohmic junction with the electron extraction layer 3.

The cathode 2 or the anode 5 in the photovoltaic element has light transmissivity. At least one of the electrodes is only required to have light transmissivity, but both the electrodes may have light transmissivity. "Having light transmissivity" means transmitting light to the degree that incident light arrives at the photoelectric conversion layer to produce an electromotive force. In other words, the electrode has light transmissivity when it has a value of more than 0% as a light transmittance. Preferably, an electrode having light transmissivity as described above has a light transmittance of 60 to 100% over the whole wavelength range of not less than 400 nm and not more than 900 nm. The thickness of an electrode having light transmissivity is not limited as long as sufficient electrical conductivity is obtained, and it varies depending on a material, but is preferably 20 nm to 300 nm. An electrode which does not have light transmissivity is only required to have electrical conductivity, and the thickness thereof is not particularly limited.

In the photovoltaic element, a hole extraction layer may be provided between the photoelectric conversion layer and the anode. Owing to the hole extraction layer, an interface state suitable for extraction of carriers can be formed, and an effect of preventing a short-circuit between electrodes is obtained. As a material to form the hole extraction layer, an electrically conductive polymer such as a polythiophene-based polymer, a poly-p-phenylenevinylene-based polymer, a polyfluorene-based polymer, a polypyrrole polymer, a polyaniline polymer, a polyfuran polymer, a polypyridine polymer or a polycarbazole polymer, a low-molecular organic compound having p-type semiconductor characteristics such as a phthalocyanine derivative ($H_2Pc$, CuPc, ZnPc or the like), a porphyrin derivative or an acene-based compound (tetracene, pentacene or the like), a carbon compound such as carbon nanotubes, graphene or graphene oxide, or an inorganic compound such as molybdenum oxide ($MoO_x$) such as $MoO_3$, tungsten oxide ($WO_x$) such as $WO_3$, nickel oxide ($NiO_x$) such as NiO, vanadium oxide ($VO_x$) such as $V_2O_5$, zirconium oxide ($ZrO_x$) such as $ZrO_2$, copper oxide ($CuO_x$) such as $Cu_2O$, copper iodide, ruthenium oxide ($RuO_x$) such as $RuO_4$, or rhenium oxide ($ReO_x$) such as $Re_2O_7$ is preferably used. Particularly, polyethylenedioxythiophene (PEDOT) as a polythiophene-based polymer, PEDOT with polystyrene sulfonate (PSS) added thereto, molybdenum oxide, vanadium oxide, or tungsten oxide is preferably used. The hole transport layer may be a layer composed of one compound, or may be a mixed layer or a laminated structure composed of two or more compounds.

The thickness of the hole transport layer is preferably 5 nm to 600 nm, more preferably 10 nm to 200 nm.

The photoelectric conversion layer 4 will now be described. The photoelectric conversion layer 4 exists between the anode 5 and the electron extraction layer 3, and contains at least an electron-donating organic semiconductor and an electron-accepting organic semiconductor as described later. Examples of the photoelectric conversion layer include layers composed of a mixture of an electron-donating organic semiconductor and an electron-accepting organic semiconductor; structures in which a layer composed of an electron-donating organic semiconductor and a layer composed of an electron-accepting organic semiconductor are laminated; and structures in which between a layer composed of an electron-donating organic semiconductor and a layer composed of an electron-accepting organic semiconductor, a layer composed of a mixture of these semiconductors is laminated. The photoelectric conversion layer may contain two or more electron-donating organic semiconductors or electron-accepting organic semiconductors. Preferably, the electron-donating organic semiconductor and the electron-accepting organic semiconductor form a mixed layer.

The content ratio of the electron-donating organic semiconductor and the electron-accepting organic semiconductor in the photoelectric conversion layer is not particularly limited, but the weight ratio of electron-donating organic semiconductor:electron-accepting organic semiconductor is preferably 1 to 99:99 to 1, more preferably 10 to 90:90 to 10, further preferably 20 to 60:80 to 40.

The thickness of the photoelectric conversion layer is not limited as long as it is large enough for the electron-donating organic semiconductor and the electron-accepting organic semiconductor to produce a photovoltaic force by absorbing light. The preferred thickness varies depending on a material, but in general, it is preferably 10 nm to 1000 nm, more preferably 50 nm to 500 nm. The photoelectric conversion layer may contain other components such as a surfactant, a binder resin and a filler.

The electron-donating organic semiconductor is not particularly limited as long as it is an organic substance having p-type semiconductor characteristics. Examples of the electron-donating organic semiconductor include conjugated polymers such as polythiophene-based polymers, 2,1,3-benzothiadiazole-thiophene-based copolymers, quinoxaline-thiophene-based copolymers, thiophene-benzodithiophene-based copolymers, poly-p-phenylenevinylene-based polymers, poly-p-phenylene-based polymers, polyfluorene-based polymers, polypyrrole-based polymers, polyaniline-based polymers, polyacetylene-based polymers and polythienylene vinylene-based polymers; and low-molecular organic compounds such as phthalocyanine derivatives such as $H_2$ phthalocyanine ($H_2Pc$), copper phthalocyanine (CuPc) and zinc phthalocyanine (ZnPc), porphyrin derivatives, tri-arylamine derivatives such as N,N'-diphenyl-N,N'-di(3-methylphenyl)-4,4'-diphenyl-1,1'-diamine (TPD) and N,N'-dinaphthyl-N,N'-diphenyl-4,4'-diphenyl-1,1'-diamine (NPD), carbazole derivatives such as 4,4'-di(carbazole-9-yl)

biphenyl (CBP), and oligothiophene derivatives (terthiophene, quarterthiophene, sexithiophene, octithiophene and the like). Two or more of these compounds may be used.

The polythiophene-based polymer is a conjugated polymer which has a thiophene backbone on the main chain, and may also have a side chain. Specific examples thereof include poly-3-alkylthiophenes such as poly-3-methylthiophene, poly-3-butylthiophenes, poly-3-hexylthiophene, poly-3-octylthiophene and poly-3-decylthiophene; poly-3-alkoxythiophenes such as poly-3-methoxythiophene, poly-3-ethoxythiophene and poly-3-dodecyloxythiophene; and poly-3-alkoxy-4-alkylthiophenes such as poly-3-methoxy-4-methylthiophene and poly-3-dodecyloxy-4-methyl thiophene.

The 2,1,3-benzothiazole-thiophene-based copolymer is a conjugated copolymer having a thiophene backbone and a 2,1,3-benzothiadiazole backbone on the main chain. Specific examples of the 2,1,3-benzothiazole-thiophene-based copolymer include the following structures. In the following formulae, n represents an integer of 1 to 1000.

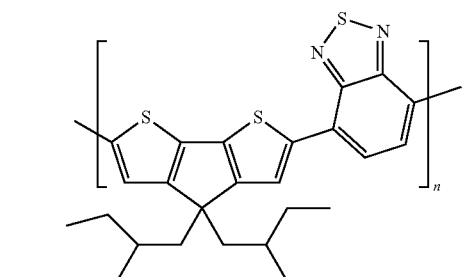

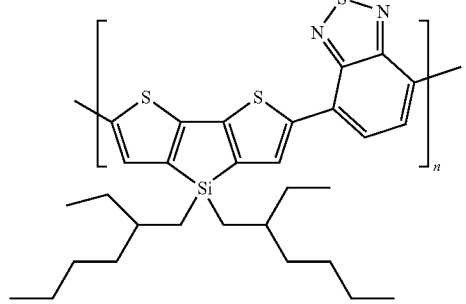

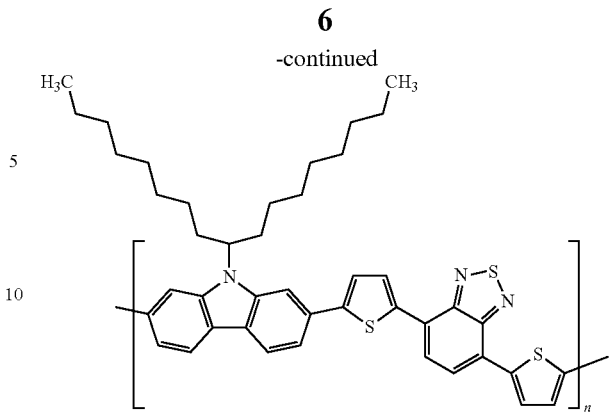

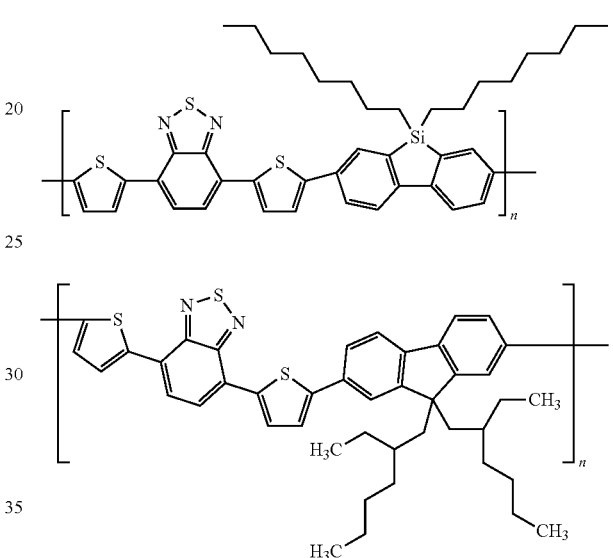

The quinoxaline-thiophene-based copolymer is a conjugated copolymer having a thiophene backbone and a quinoxaline backbone on the main chain. Specific examples of the quinoxaline-thiophene-based copolymer include the following structures. In the following formulae, n represents an integer of 1 to 1000.

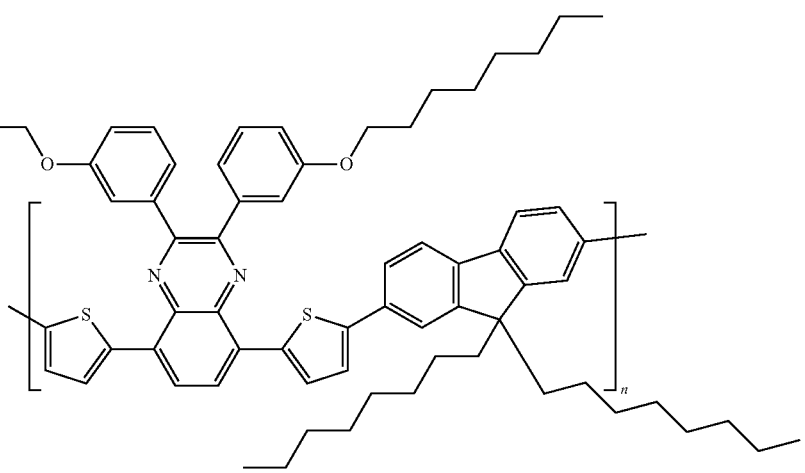

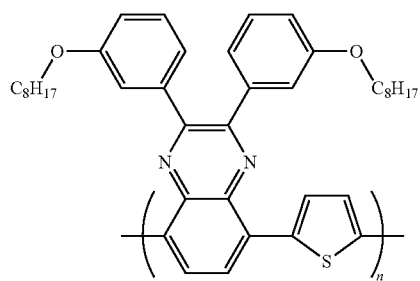
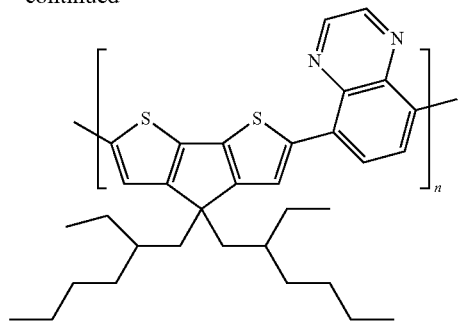
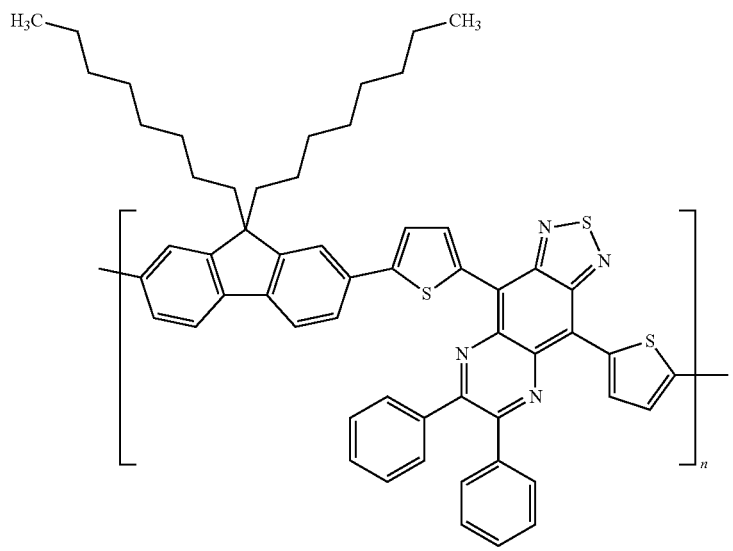
The thiophene-benzodithiophene-based copolymer is a conjugated copolymer having a thiophene backbone and a benzodithiophene backbone on the main chain. Specific examples of the thiophene-benzodithiophene-based copolymer include the following structures. In the following formulae, n represents an integer of 1 to 1000.
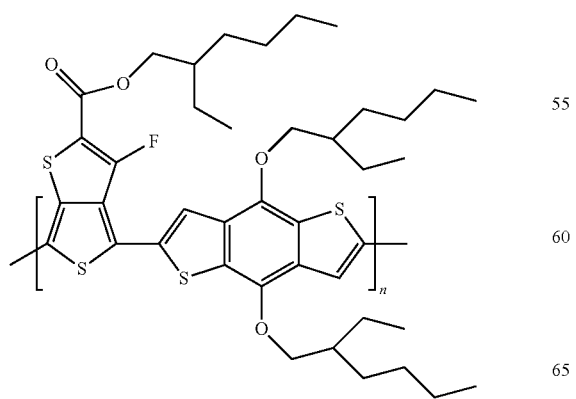

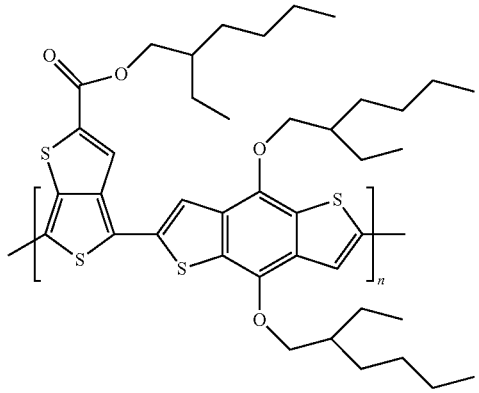

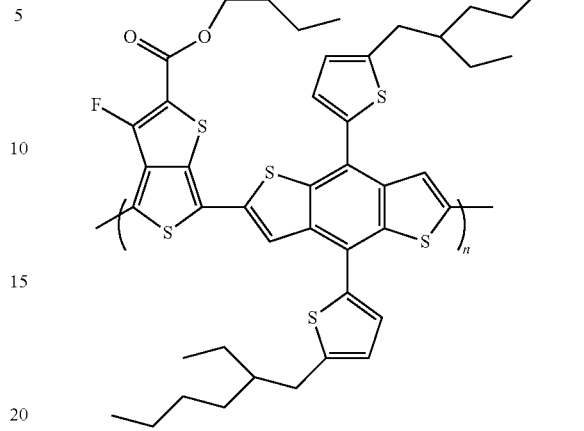

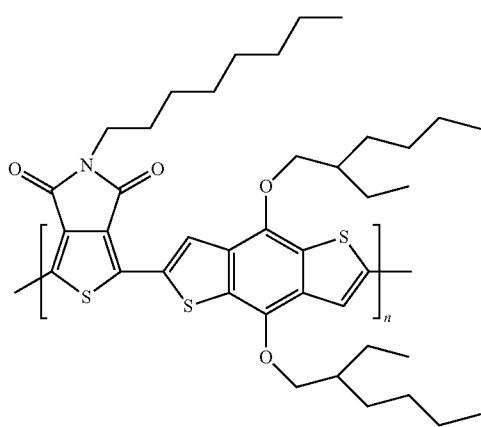

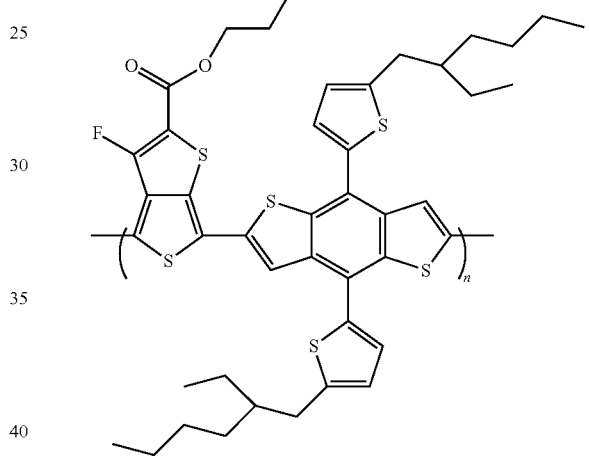

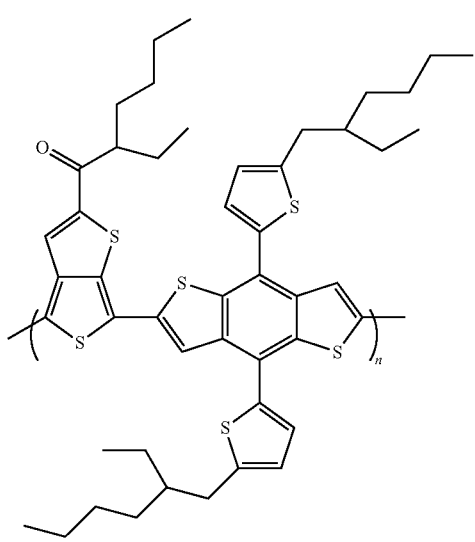

The poly-p-phenylenevinylene-based polymer is a conjugated polymer which has a p-phenylenevinylene backbone on the main chain, and may also have a side chain. Specific examples thereof include poly[2-methoxy-5-(2-ethylhexyloxy)-1,4-phenylenevinylene] and poly[2-methoxy-5-(3',7'-dimethyloctyloxy)-1,4-phenylenevinylene].

The electron-accepting organic semiconductor is not particularly limited as long as it is an organic substance having n-type semiconductor characteristics. Examples thereof include 1,4,5,8-naphthalenetetracarboxylic dianhydride, 3,4,9,10-perylenetetracarboxylic dianhydride, N,N-dioctyl-3,4,9,10-naphthyltetracarboxydiimide, oxazole derivatives (2-(4-biphenyl)-5-(4-t-butylphenyl)-1,3,4-oxadiazole, 2,5-di(1-naphthyl)-1,3,4-oxadiazole and the like), triazole derivatives (3-(4-biphenylyl)-4-phenyl-5-(4-t-butylphenyl)-1,2,4-triazole and the like), phenanthroline derivatives, fullerene derivatives, carbon nanotubes, and derivatives with cyano groups introduced in a poly-p-phenylenevinylene-based polymer (CN-PPV). Two or more of these compounds may be used. A fullerene derivative is preferably used because it is an n-type semiconductor which is stable and has a high carrier mobility.

Specific examples of the fullerene derivative include unsubstituted derivatives of $C_{60}$, $C_{70}$, $C_{76}$, $C_{78}$, $C_{82}$, $C_{84}$, $C_{90}$, $C_{94}$ and the like, and substituted derivatives such as [6,6]-phenyl C61 butyric acid methyl esters ([6,6]-C61-PCBM or [60]PCBM), [5,6]-phenyl C61 butyric acid methyl esters, [6,6]-phenyl C61 butyric acid hexyl esters, [6,6]-phenyl C61 butyric acid dodecyl esters and phenyl C71 butyric acid methyl esters ([70]PCBM). Among them, [70] PCBM is more preferable.

The electron extraction layer 3 will now be described. The electron extraction layer 3 contains an inorganic compound (A), and an organic compound (B) having an electron-donating group and a bonding group.

Examples of the inorganic compound (A) include metal oxides such as titanium oxide ($TiO_x$) such as $TiO_2$, zinc oxide ($ZnO_x$) such as ZnO, silicon oxide ($SiO_x$) such as $SiO_2$, tin oxide ($SnO_x$) such as $SnO_2$, indium oxide ($InO_x$) such as $In_2O_3$, molybdenum oxide ($MoO_x$) such as $MoO_3$, tungsten oxide ($WO_x$) such as $WO_3$, tantalum oxide ($TaO_x$) such as $Ta_2O_3$, barium titanate ($BaTi_xO_y$) such as $BaTiO_3$, barium zirconate ($BaZr_xO_y$) such as $BaZrO_3$, zirconium oxide ($ZrO_x$) such as $ZrO_2$, hafnium oxide ($HfO_x$) such as $HfO_2$, aluminum oxide ($AlO_x$) such as $Al_2O_3$, yttrium oxide ($YO_x$) such as $Y_2O_3$ and zirconium silicate ($ZrSi_xO_y$) such as $ZrSiO_4$; nitrides such as silicon nitride ($SiN_x$) such as $Si_3N_4$; and semiconductors such as cadmium sulfide ($CdS_x$) such as CdS, zinc selenide ($ZnSe_x$) such as ZnSe, zinc sulfide ($ZnS_x$) such as ZnS, and cadmium telluride ($CdTe_x$) such as CdTe. Among them, inorganic oxides are preferable because they are easily bonded to the organic compound (B) via oxygen atoms. From the viewpoint of electron extraction efficiency and electron transfer, n-type semiconductors are preferable, and from the viewpoint of n-type semiconductor characteristics, the inorganic oxide contains preferably at least any of zinc, titanium, tin and indium, further preferably at least zinc or titanium. The electron extraction layer may contain compounds other than the above-mentioned inorganic compounds to the extent that electron extraction and electron transfer are not hindered. Accordingly, when in formation of an inorganic compound layer, a method including applying and heating a precursor solution of a metal salt, a metal alkoxide or the like to form the inorganic compound layer, or a method including applying a nanoparticle dispersion liquid to a substrate to form the layer is used, an intermediate product, or a mixture of a precursor, an intermediate product, a final product and so on may be formed due to occurrence of partial hydrolysis or partial condensation as the reaction does not fully proceed depending on a heating temperature and time, and conditions for synthesis of nanoparticles.

The electron-donating group in the organic compound (B) is not particularly limited as long as it is a group capable of relatively increasing the surface energy level of the inorganic compound (A). In other words, it suffices that the electron-donating group has an effect of decreasing the Fermi level of the electron extraction layer, which is measured by X-ray photoelectron spectroscopy (XPS) or ultraviolet photoelectron spectroscopy (UPS), as described in "Advanced Materials", 2014, Vol. 26, pages 494-500. The electron-donating group may be substituted to the extent that the electron-donating effect is not hindered. The organic compound (B) may have two or more electron-donating groups, and may have two or more kinds of electron-donating groups in this case.

Examples of the electron-donating group include amino groups, aromatic amino groups, alkoxy groups, thienyl groups and furanyl groups. The amino group is a primary amino group (—$NH_2$), a secondary amino group (—$NHR^1$) or a tertiary amino group (—$NR^2R^3$). $R^1$ to $R^3$ each represent any organic group that does not hinder the electron-donating effect, and may be bonded together to form a ring. The aromatic amino group is an amino group having aromaticity such as a pyridyl group, a pyridylamino group, an anilyl group, a pyrazyl group, a pyrimidyl group, a pyrazolyl group, an imidazole group or an imidazolyl group. The alkoxy group is a hydrocarbon group which is bonded via an ether bond such as a methoxy group, an ethoxy group, a propoxy group or a butoxy group. The electron-donating group is preferably an amino group, and more preferably a primary amino group from the viewpoint of electron-donating intensity.

The organic compound (B) is preferably a compound having a hydrocarbon group substituted with an electron-donating group, and a bonding group. As the hydrocarbon group, an alkyl group, an alkenyl group, an alkynyl group, an alkoxy group or an aryl group is preferable, and an alkyl group or aryl group with a carbon number of 1 to 20 is especially preferable because the electron-donating group and the inorganic compound are required to interact with each other. The hydrocarbon group itself may serve as an electron-donating group. The alkyl group is a saturated aliphatic hydrocarbon group such as a methyl group, an ethyl group, a propyl group or a butyl group. The alkenyl group is an unsaturated aliphatic hydrocarbon group including one double bond such as a vinyl group, a propenyl group or a butenyl group. The alkynyl group is an unsaturated aliphatic hydrocarbon group including one triple bond such as an ethynyl group, a propynyl group or a butynyl group. The aryl group is an aromatic hydrocarbon group such as a phenyl group, a naphthyl group, a biphenyl group, a phenanthryl group, an anthryl group, a terphenyl group, a pyrenyl group, a fluorenyl group, a perylenyl group, an indenyl or an azulenyl group.

The organic compound (B) may be a compound having a heterocyclic group substituted with an electron-donating group, and a bonding group as long as the effect of the electron-donating group is not hindered. The heterocyclic group is a group composed of an aliphatic ring or aromatic ring having atoms other than carbon in the ring such as an epoxy group, an aziridinyl group, an episulfide group, an oxolanyl group, a pyrrolidinyl group, a thiolanyl group, an oxanyl group, a piperidinyl group, a thianyl group, a pyridyl group, a thienyl group, a furyl group, a pyrrolyl group, an oxazolyl group, a thiazolyl group, an oxadiazolyl group, a thiadiazolyl group, a pyrazyl group, a pyrimidyl group, a pyrazolyl group, an imidazolyl group, a benzodithienyl group, a dibenzofuryl group, a dibenzothienyl group, a phenylcarbazolyl group, a phenoxathienyl group, a xanthenyl group, a benzofuranyl group, a thianthrenyl group, an indolizinyl group, a phenoxazinyl group, a phenothiazinyl group, an acridinyl group, a phenanthrolyl group, a phenanthridinyl group, a quinolyl group, an isoquinolyl group, an indolyl group, a quinoxalinyl group, a silole group, a benzosilole group or a dibenzosilole group.

The hydrocarbon group or heterocyclic group substituted with an electron-donating group may also be substituted with a group other than an electron-donating group to the extent that the effect of the electron-donating group is not hindered. Examples of the substituent here include alkyl groups, alkenyl groups, alkynyl groups, aryl groups, heterocyclic groups, halogen atoms, hydroxyl groups, cyano groups, carboxyl groups, carbonyl groups, acetyl groups, sulfonyl groups, silyl groups, boryl groups, nitrile groups and combinations thereof.

The bonding group in the organic compound (B) is a bi-or-more-valent group that forms a bond with constituent atoms (e.g. hydroxyl groups or the like) of the inorganic compound (A) or precursor thereof, and the chemical structure of the bonding group is not particularly limited, but to secure a high bonding strength, the bonding group is preferably any of a silyl group, a phosphonyl group, a sulfide group, a sulfonyl group and a carbonyl group, especially preferably a silyl group. The bonding group exists in the form of a bonding functional group, i.e. a precursor before undergoing a bonding reaction with the inorganic compound (A), and the bonding functional group is preferably an alkoxysilyl group, a chlorosilyl group, a sulfonylchloride group, a carboxy group, a phosphoric acid group or a thiol group.

The electron extraction layer has a structure in which the inorganic compound (A) and at least a part of the organic compound (B) having an electron-donating group and a bonding group are bonded to each other via a bonding group of the organic compound (B) and this structure is referred to as an inorganic/organic hybrid structure. The phrase "at least a part of" means that existence of a part of the organic compound (B), which is not bonded to the inorganic compound (A), is not excluded. Since the electron extraction layer has the inorganic/organic hybrid structure, liberation of the electron-donating group and the like is suppressed so that the electron extraction layer is stable and has excellent durability. The inorganic/organic hybrid structure may be a structure of mixed type in which the inorganic compound (A) and the organic compound (B) are bonded to each other in a mixed state, or a structure of laminated type in which the organic compound (B) is bonded to a surface of a layer containing the inorganic compound (A).

When the electron extraction layer has a structure of a mixed type in which the inorganic compound (A) and the organic compound (B) are bonded to each other in a mixed state, the content ratio of the inorganic compound (A) part that bears electron transport is preferably high, and the content ratio of the organic compound (B) part is preferably low to the degree that electron transport is not hindered. The content ratios of the inorganic compound (A) and the organic compound (B) are not particularly limited, but the weight ratio of the inorganic compound (A) is preferably 50% or more.

Specific examples of the structure in which the inorganic compound (A) and the organic compound (B) are bonded to each other via a bonding group include, but are not particularly limited to, the following structures.

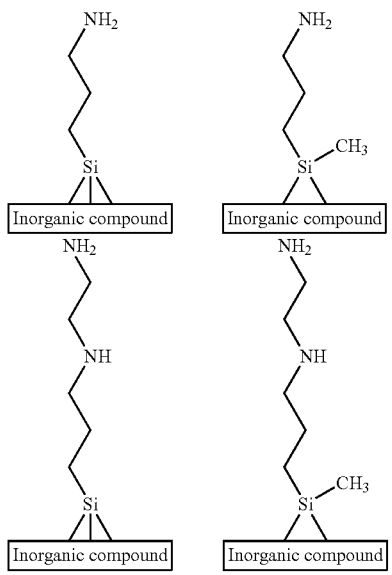

-continued

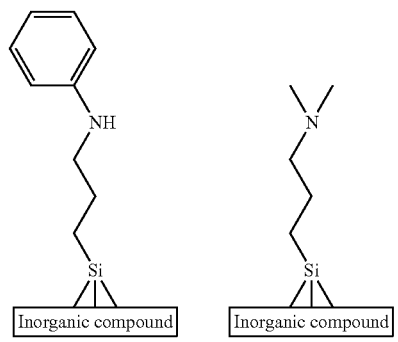

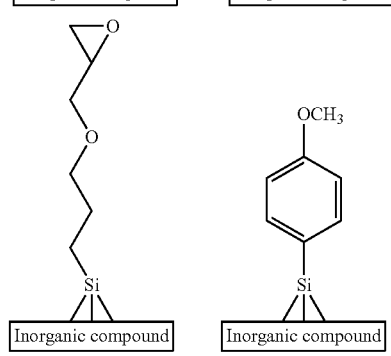

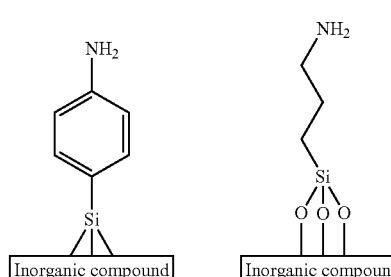

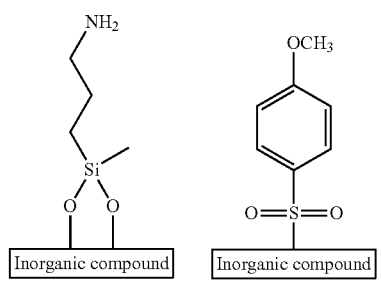

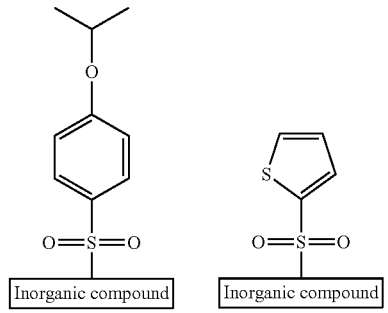

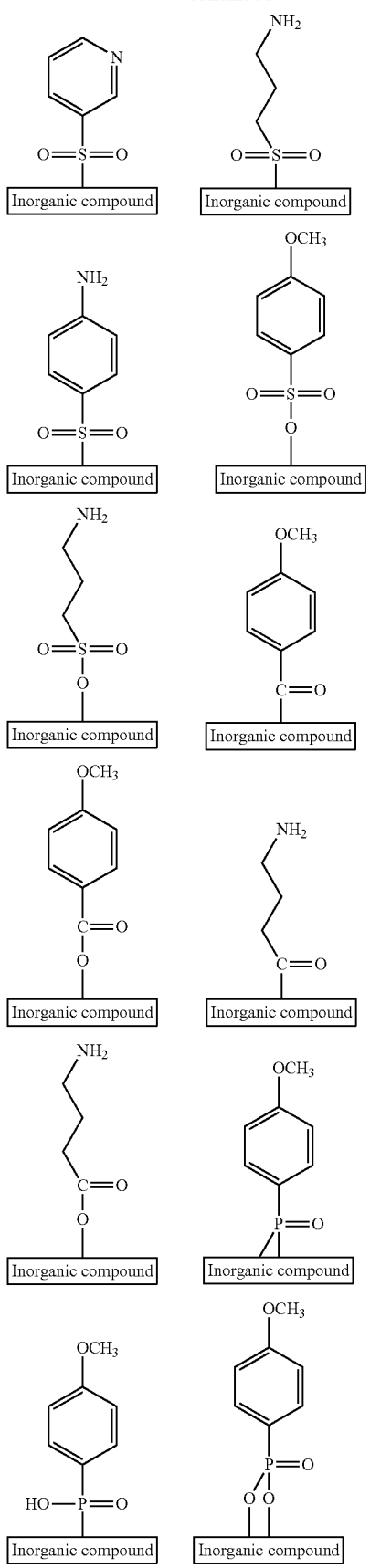
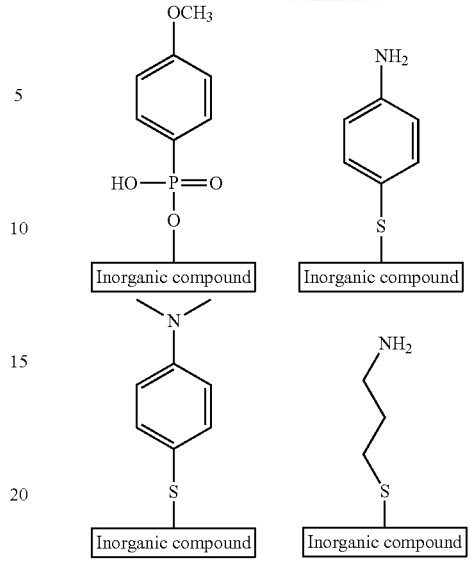

The electron extraction layer may contain substances other than the inorganic compound (A) and the organic compound (B) to the extent that the desired effect is not hindered. As one of aspects preferred for further improving the electron transport property, for example, the electron extraction layer contains a substance having an electron transport property, particularly an electron transporting organic substance having n-type semiconductor characteristics as mentioned as an electron-accepting organic semiconductor contained in the photoelectric conversion layer.

In addition, the electron extraction layer may contain substances having no electron transport property to the extent that extraction of electrons from the photoelectric conversion layer to the cathode is markedly hindered. These substances may form a mixed layer with the inorganic compound (A) and/or the organic compound (B), or may be laminated separately from these compounds.

The thickness of the electron extraction layer is not limited as long as it is large enough to perform electron extraction, but when the electron extraction layer is excessively thick, electron extraction efficiency may be deteriorated. The thickness of the electron extraction layer cannot be determined definitely because it is only required to be appropriately set to a desired thickness according to the photoelectric conversion efficiency of a desired photovoltaic element, but generally the thickness is preferably 0.1 nm to 1000 nm, more preferably 0.5 nm to 100 nm, further preferably 5 nm to 50 nm.

Two or more photoelectric conversion layers may be laminated (formed into a tandem) with one or more charge recombination layer interposed between the photoelectric conversion layers, thereby forming a junction in series. Mention may be made of, for example, a laminated structure of substrate/cathode/first electron extraction layer/first photoelectric conversion layer/charge recombination layer/second electron extraction layer/second photoelectric conversion layer/anode. The charge recombination layer is considered to also serve as a cathode and an anode for the adjacent photoelectric conversion layer. By laminating the layers as described above, the open circuit voltage can be improved. The hole extraction layer may be provided between the charge recombination layer and the first photoelectric conversion layer and between the anode and the second photoelectric conversion layer.

The charge recombination layer to be used here is required to have light transmissivity so that a plurality of photoelectric conversion layers can absorb light. Since it is only required to suffice that the charge recombination layer is designed such that holes and electrons are sufficiently recombined, the charge recombination layer is not necessarily required to be a film, and may be, for example, a metal cluster formed uniformly on the photoelectric conversion layer. Accordingly, for the charge recombination layer, a very thin metal film or metal cluster (or alloy film or alloy cluster) composed of gold, platinum, chromium, nickel, lithium, magnesium, calcium, tin, silver, aluminum or the like, having a thickness of several angstroms to several tens angstroms and having light transmissivity; a metal oxide film or cluster having high light transmissivity such as that of ITO, IZO, AZO, GZO, FTO, titanium oxide or molybdenum oxide; an electrically conductive organic material film of PEDOT with PSS added thereto, or the like; a composite thereof; or the like is used. For example, a uniform silver cluster can be formed by vapor-depositing silver using a vacuum vapor deposition method such that the thickness is several angstroms to 1 nm in a crystal oscillator thickness monitor. In addition, when a titanium oxide film is to be formed, a sol-gel method as described in "Advanced Materials", 2006, Vol. 18, pages 572-576 may be used. To deposit a composite metal oxide such as ITO or IZO, a sputtering method may be used. The method of forming a charge recombination layer and the type thereof are only required to be appropriately selected with consideration given to nondestruction of the photoelectric conversion layer during formation of the charge recombination layer, the method of forming a photoelectric conversion layer to be subsequently deposited.

In production of a photovoltaic element, first an electrode (cathode) is formed on a substrate by a sputtering method or the like. An electron extraction layer is formed on the electrode.

The electron extraction layer has an inorganic/organic hybrid structure, and as described above, the inorganic/organic hybrid structure may be a structure of mixed type in which the inorganic compound (A) and the organic compound (B) are bonded to each other in a mixed state, or a structure of laminated type in which the organic compound (B) is bonded to a surface of a layer containing the inorganic compound (A).

When an electron extraction layer having an inorganic/organic hybrid structure of mixed type is prepared, an electron extraction layer material containing the inorganic compound (A) or precursor thereof and the organic compound (B) is mixed with a solvent, and the mixture is dissolved by a method such as heating, stirring or ultrasonic wave irradiation to prepare a solution. The inorganic compound (A) or precursor thereof and the organic compound (B) exist in contact with each other in the solution and, accordingly, the solution is applied onto the electrode to form a layer, followed by carrying out a reaction for bonding the inorganic compound (A) and the organic compound (B) to each other.

An electron extraction layer having a similar inorganic/organic hybrid structure can be formed in the following manner: an electron extraction layer material containing the inorganic compound (A) or precursor thereof and the organic compound (B) is mixed with a solvent, a reaction for bonding the inorganic compound (A) or precursor thereof and the organic compound (B) to each other in the solution is carried out, and the solution is then applied onto the electrode to form a layer.

When an electron extraction layer having an inorganic/organic hybrid structure of laminated type is prepared, a layer composed of the inorganic compound (A) or precursor thereof is first formed on the electrode, a solution of the organic compound (B) is then applied to the surface of the layer to form a layer of the organic compound (B), and a reaction to bond the inorganic compound (A) and the organic compound (B) to each other is carried out while both the compounds are in contact with each other at the interface of both the layers so that the inorganic/organic hybrid structure can be formed. As a method of forming a layer containing the inorganic compound (A), a method in which the layer is deposited by a vacuum vapor deposition method or a sputtering method, or a method in which a dispersion liquid (e.g. nanoparticle dispersion liquid) of the inorganic compound (A) is applied onto the electrode, and heat-treated can be used.

Formation of an electron extraction layer having an inorganic/organic hybrid structure of mixed type in combination of laminated type in which the organic compound (B) is further bonded to the surface of a layer having an inorganic/organic hybrid structure of mixed type is also a preferred aspect.

When the precursor of the inorganic compound (A) is used, it is preferable that the precursor is converted into the inorganic compound (A) concurrently with the bonding reaction with the organic compound (B). For example, when the inorganic compound (A) is a metal oxide, and the bonding functional group in the organic compound (B) is an alkoxysilyl group, a chlorosilyl group or the like, a reaction to bond the inorganic compound (A) and the organic compound (B) to each other while converting the precursor into the inorganic compound (A) by heating can be carried out by using as the precursor of the inorganic compound (A) a metal compound (e.g. a metal salt, metal alkoxide or the like) which is oxidized by heating or the like. The reaction for converting the precursor of the inorganic compound (A) into the inorganic compound (A) and the bonding reaction of the inorganic compound (A) and the organic compound (B) may be carried out as different steps. Conversion of the precursor into the inorganic compound (A) may be incomplete as long as the electron extraction layer has a sufficient electron transport property, and even a state in which a part of the inorganic compound (A) remains being a precursor after the reaction should not be excluded from this disclosure.

Examples of the precursor of the inorganic compound (A) include metal salts and metal alkoxide compounds, and specific examples thereof include zinc formate, zinc acetate, zinc propionate, zinc butyrate, zinc oxalate, zinc acetylacetonate, bi s[2-(2-benzothiazolyl)phenolate]zinc, bis[2-(2-benzoxazolyl)phenolate]zinc, bis(8-quinolinolato)zinc, ammonium metavanadate, ammonium molybdate, ammonium hexafluorozirconate, sodium tungstate, ammonium tetrachlorozincate, tetraisopropyl orthotitanate, lithium nickelate, potassium permanganate, silver phenanthroline complexes, AgTCNQ, titanium alkoxide compounds (bis(2,4-pentanedionato)titanium (IV) oxide, tetrabutoxytitanium, titanium isobutoxide, tetraisopropyl orthotitanate, and so on), zinc alkoxide compounds (zinc tert-butoxide or the like), and compounds to be used in an electron transport layer as described in Japanese Patent Laid-open Publication No. 2013-58714.

Examples of the dispersion liquid of the inorganic compound (A) include zinc oxide nanoparticle dispersion liquids, zinc oxide nanorod dispersion liquids and titanium oxide nanoparticle dispersion liquids.

Examples of the organic compound (B) having an electron-donating group and a bonding functional group include 3-aminopropyltri ethoxy silane, 3-aminopropyltrimethoxysilane, 3-aminopropyl di ethoxymethyl silane, 3-(2-aminoethyl amino)propyltrimethoxysilane, 3-(2-aminoethylamino)propyldimethoxymethylsilane, 3-(2-aminoethylamino)propyltriethoxysilane, trimethoxy[3-(phenyl amino)propyl]silane, trimethoxy[3-(methylamino) propyl]silane, 3-glycidyloxypropyltrimethoxysilane, decyltrichlorosilane, dodecyltriethoxysilane, octadecyltriethoxysilane, methanesulfonyl chloride, ethanesulfonyl chloride, isopropyl sulfonyl chloride, 1-butane sulfonyl chloride, cyclopropanesulfonyl chloride, 4-methoxybenzene sulfonyl chloride, 4-isopropoxybenzenesulfonyl chloride, 2-thiophene sulfonyl chloride, pyridine-3-sulfonylchloride, 4-methoxybenzoic acid, 4-methoxybenzoyl chloride, 4-methoxyphenylphosphonic acid, decylphosphonic acid, octadecylphosphonic acid, 4-methoxyphenyldichlorophosphate, 4-aminobenzenethiol, 2,3-butanedithiol, 1-butanethiol, 2-butanethiol, cyclohexanethiol, cyclopentanethiol, 1-decanethiol and 4-(dimethylamino)benzenethiol.

Examples of the solvent to be used in mixing include water; aliphatic hydrocarbons such as hexane, heptane, octane, isooctane, nonane, decane, cyclohexane, decalin and bicyclohexyl; alcohols such as methanol, ethanol, butanol, propanol, ethylene glycol and glycerin; ketones such as acetone, methyl ethyl ketone, cyclopentanone, cyclohexanone and isophorone; esters such as ethyl acetate, butyl acetate, methyl lactate, γ-butyrolactone, diethylene glycol monobutyl ether acetate and dimethyl carbonate; ethers such as ethyl ether, methyl tertiary butyl ether, tetrahydrofuran, 1,4-dioxane, tetrahydropyran, 3,4-dihydro-2H-pyran, isochroman, ethylene glycol monomethyl ether and diglyme; amines such as ammonia and ethanolamine; amides such as N,N-dimethylformamide, dimethylacetamide and N-methyl-2-pyrrolidone; sulfones such as sulfolane; sulfoxides such as dimethylsulfoxide; thiols such as carbon disulfide and 1,8-octanedithiol; nitriles such as acetonitrile and acrylonitrile; fatty acids such as acetic acid and lactic acid, heterocyclic compounds such as furan, thiophene, pyrrole and pyridine; aromatic hydrocarbons such as benzene, toluene, xylene, ethylbenzene, cumene, n-butylbenzene, sec-butylbenzene, tert-butylbenzene, styrene, mesitylene, 1,2,4-trimethylbenzene, p-cymene, cyclohexylbenzene, diethylbenzene, pentylbenzene, dipentylbenzene, dodecylbenzene, ethynylbenzene, tetralin, anisole, phenetole, butyl phenyl ether, pentyl phenyl ether, veratrole, 1,3-dimethoxybenzene, 1,2,4-trimethoxybenzene, 2-methoxytoluene, 2,5-dimethylanisole, o-chlorophenol, chlorobenzene, dichlorobenzene, trichlorobenzene, 1-chloronaphthalene, 1-bromonaphthalene, 1-methylnaphthalene, o-diiodobenzene, acetophenone, 2,3-benzofuran, 2,3-dihydrobenzofuran, 1,4-benzodioxane, phenyl acetate, methyl benzoate, cresol, aniline and nitrobenzene; and halogen hydrocarbons such as dichloromethane, 1,2-dichloroethylene, trichloroethylene, tetrachloroethylene, chloroform, carbon tetrachloride, di chloroethane, trichloroethane, 1,3-dichloropropane, 1,1,1,2-tetrachloroethane, 1,1,1,3-tetrachloropropane, 1,2,2,3-tetrachloropropane, 1,1,2,3-tetrachloropropane, pentachloropropane, hexachloropropane, heptachloropropane, 1-bromopropane, 1,2-dibromopropane, 2,2-dibromopropane, 1,3-dibromopropane, 1,2,3-tribromopropane, 1,4-dibromobutane, 1,5-dibromopentane, 1,6-dibromohexane, 1,7-dibromoheptane, 1,8-dibromooctane, 1-iodopropane, 1,3-diiodopropane, 1,4-diiodobutane, 1,5-diiodopentane, 1,6-diiodohexane, 1,7-diiodoheptane and 1,8-diiodooctane. Among them, aromatic hydrocarbons such as toluene, xylene, mesitylene, 1,2,4-trimethylbenzene, tetralin, anisol, phenetole, veratrole, 1,3-dimethoxybenzene, 1,2,4-trimethoxybenzene, 2-methoxytoluene, 2,5-dimethylanisole, chlorobenzene, dichlorobenzene, trichlorobenzene and 1-chloronaphthalene; and halogen hydrocarbons such as chloroform, dichloromethane, 1,2-dibromopropane, 1,3-dibromopropane, 1,2,3-tribromopropane, 1,4-dibromobutane, 1,6-dibromohexane, 1,8-dibromooctane, 1,3-diiodopropane, 1,4-diiodobutane, 1,5-diiodopentane, 1,6-diiodohexane, 1,7-diiodoheptane and 1,8-diiodooctane can be preferably used. Two or more of these compounds may be used in combination.

When an electron extraction layer material solution containing the inorganic compound (A) or precursor thereof and the organic compound (B), or an electron extraction layer material solution containing the organic compound (B) bonded to the inorganic compound (A) or precursor thereof is applied to the cathode, or when a solution of the inorganic compound (A) or precursor thereof is applied to the cathode, or when a solution containing the organic compound (B) is applied to the surface of a layer containing the inorganic compound (A), any of methods such as spin coating, blade coating, slit die coating, screen printing coating, bar coater coating, mold coating, a transfer printing method, an immersion and pull-up method, an inkjet method, a spraying method and a vacuum vapor deposition method may be used, and a formation method including thickness control, orientation control or the like may be selected according to film quality to be obtained.

The photoelectric conversion layer 4 can be formed in the following manner: a photoelectric conversion element material containing an electron-donating organic semiconductor material and an electron-accepting organic material is dissolved in a solvent to prepare a solution, and the solution is applied onto the electron extraction layer 3. The solvent to be used here is not particularly limited as long as an organic semiconductor can be appropriately dissolved or dispersed in the solvent, but an organic solvent is preferable. Examples thereof include aliphatic hydrocarbons such as hexane, heptane, octane, isooctane, nonane, decane, cyclohexane, decalin and bicyclohexyl; alcohols such as methanol, ethanol, butanol, propanol, ethylene glycol and glycerin; ketones such as acetone, methyl ethyl ketone, cyclopentanone, cyclohexanone and isophorone; esters such as ethyl acetate, butyl acetate, methyl lactate, γ-butyrolactone, diethylene glycol monobutyl ether acetate and dimethyl carbonate; ethers such as ethyl ether, methyl tertiary butyl ether, tetrahydrofuran, 1,4-dioxane, tetrahydropyran, 3,4-dihydro-2H-pyran, isochroman, ethylene glycol monomethyl ether and diglyme; amines such as ammonia and ethanolamine; amides such as N,N-dimethylformamide, dimethylacetamide and N-methyl-2-pyrrolidone; sulfones such as sulfolane; sulfoxides such as dimethylsulfoxide; thiols such as carbon disulfide and 1,8-octanedithiol; nitriles such as acetonitrile and acrylonitrile; fatty acids such as acetic acid and lactic acid, heterocyclic compounds such as furan, thiophene, pyrrole and pyridine; aromatic hydrocarbons such as benzene, toluene, xylene, ethylbenzene, cumene, n-butylbenzene, sec-butylbenzene, tert-butylbenzene, styrene, mesitylene, 1,2,4-trimethylbenzene, p-cymene, cyclohexylbenzene, diethylbenzene, pentylbenzene, dipentylbenzene, dodecylbenzene, ethynylbenzene, tetralin, anisole, phenetole, butyl phenyl ether, pentyl phenyl ether, veratrole, 1,3-dimethoxybenzene, 1,2,4-trimethoxybenzene, 2-methoxytoluene, 2,5-dimethylanisole, o-chlorophenol, chlorobenzene, dichlorobenzene, trichlorobenzene, 1-chloronaphthalene, 1-bromonaphthalene, 1-methylnaphthalene, o-diiodobenzene, acetophenone, 2,3-benzofuran, 2,3-dihydrobenzofuran, 1,4-benzodioxane, phenyl acetate, methyl benzoate, cresol, aniline and nitrobenzene; and halogen hydrocarbons such as dichloromethane, 1,2-dichloroethylene, trichloroethylene, tetrachloroethylene, chloroform, carbon tetrachloride, di chloroethane, trichloroethane, 1,3-dichloropropane, 1,1,1,2-tetrachloroethane, 1,1,1,3-tetrachloropropane, 1,2,2,3-tetrachloropropane, 1,1,2,3-tetrachloropropane, pentachloropropane, hexachloropropane, heptachloropropane, 1-bromopropane, 1,2-dibromopropane, 2,2-dibromopropane, 1,3-dibromopropane, 1,2,3-tribromopropane, 1,4-dibromobutane, 1,5-dibromopentane, 1,6-dibromohexane, 1,7-dibromoheptane, 1,8-dibromooctane, 1-iodopropane, 1,3-diiodopropane, 1,4-diiodobutane, 1,5-diiodopentane, 1,6-diiodohexane, 1,7-diiodoheptane and 1,8-diiodooctane. Among them, aromatic hydrocarbons such as toluene, xylene, mesitylene, 1,2,4-trimethylbenzene, tetralin, anisol, phenetoleveratrole, 1,3-dimethoxybenzene, 1,2,4-trimethoxybenzene, 2-methoxytoluene, 2,5-dimethylanisole, chlorobenzene, dichlorobenzene, trichlorobenzene and 1-chloronaphthalene; and halogen hydrocarbons such as chloroform, dichloromethane, 1,2-dibromopropane, 1,3-dibromopropane, 1,2,3-tribromopropane, 1,4-dibromobutane, 1,6-dibromohexane, 1,8-dibromooctane, 1,3-diiodopropane, 1,4-diiodobutane, 1,5-diiodopentane, 1,6-diiodohexane, 1,7-diiodoheptane and 1,8-diiodooctane are preferable. Two or more of these compounds may be used in combination.

When an electron-donating organic material and an electron-accepting organic material are mixed to form a photoelectric conversion layer, the electron-donating organic material and the electron-accepting organic material are added to a solvent at a desired ratio and dissolved in the solvent by a method such as heating, stirring or ultrasonic wave irradiation to prepare a solution, and the solution is applied onto the electron extraction layer 3. When the electron-donating organic material and the electron-accepting organic material are laminated to form a photoelectric conversion layer, for example, a solution of the electron-donating organic material is applied to form a layer containing the electron-donating organic material, and a solution of the electron-accepting organic material is then applied to form a layer. When the electron-donating organic material and the electron-accepting organic material are low-molecular-weight materials each having a molecular weight of 1000 or less, the layer can also be formed using a vapor deposition method.

To form the photoelectric conversion layer, the same coating method as in formation of the electron extraction layer can be used, and a formation method including thickness control, orientation control or the like may be selected according to photoelectric conversion layer characteristics to be obtained. For example, when spin coating is performed, the concentration of the electron-donating organic material and the electron-accepting organic material (the weight of the electron-donating organic material and the electron-accepting organic material with respect to the volume of a solution containing the electron-donating organic material and the electron-accepting organic material, and a solvent) is preferably 1 to 20 g/l, and with this concentration, a homogeneous photoelectric conversion layer having a thickness of 5 to 200 nm can be obtained. The formed photoelectric conversion layer may be subjected to an annealing treatment under reduced pressure, an inert atmosphere (nitrogen or argon atmosphere) or the like for removing the solvent. The temperature in the annealing treatment is preferably 40° C. to 300° C., more preferably 50° C. to 200° C. The annealing treatment may be formed after formation of the hole extraction layer or anode.

When a hole extraction layer is provided between the anode and the photoelectric conversion layer, a desired material (PEDOT: PSS or the like) is applied onto the photoelectric conversion layer, and the solvent is removed using a vacuum thermostatic bath, a hot plate or the like so that the hole extraction layer is formed. As a coating method, the same coating method as in formation of the electron extraction layer can be used. When an inorganic material such as molybdenum oxide is used, a vacuum vapor deposition method or a sputtering method can be applied.

The anode 5 is formed by depositing a metal electrode of Ag or the like on the photoelectric conversion layer 4 (or hole extraction layer) by a vacuum vapor deposition method or a sputtering method. When the hole extraction layer is formed by vacuum vapor deposition, it is preferable to subsequently form a metal electrode while maintaining the vacuum state.

A method in which a cathode is first formed on a substrate, and layers are formed in order from the cathode side to prepare a photovoltaic element has been described above, but mention is also made of a method of producing a photovoltaic element in which an electrode (anode) is formed on a substrate by a sputtering method or the like, and on the electrode, a hole extraction layer, a photoelectric conversion layer, an electron extraction layer having an inorganic/organic hybrid structure, and an electrode (cathode) are formed in this order. In this case, the photovoltaic element has a reversed laminated structure, where the electron extraction layer is formed on the photoelectric conversion layer, but otherwise there is no difference.

The photovoltaic element can be applied to various photoelectric conversion devices which utilize a photoelectric conversion function, an optical rectification function and so on. The photovoltaic element is useful for, for example, photo-cells (solar cells and the like), electronic elements (optical sensors, optical switches, phototransistors and the like), optical recording materials (optical memories and the like), image pick-up elements, and so on.

EXAMPLES

Hereinafter, our photovoltaic elements will be described further in detail on the basis of examples. This disclosure is not limited to the following examples. Among compounds used in the examples, those specified by abbreviations are shown below.

Isc: short-circuit current density

Voc: open circuit voltage

η: photoelectric conversion efficiency

ITO: Indium tin oxide

A-1: compound represented by the following formula

A-2: compound represented by the following formula (A-1)

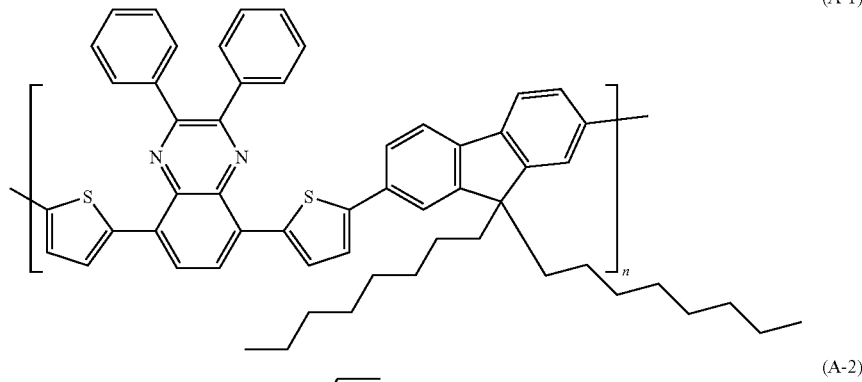

(A-2)

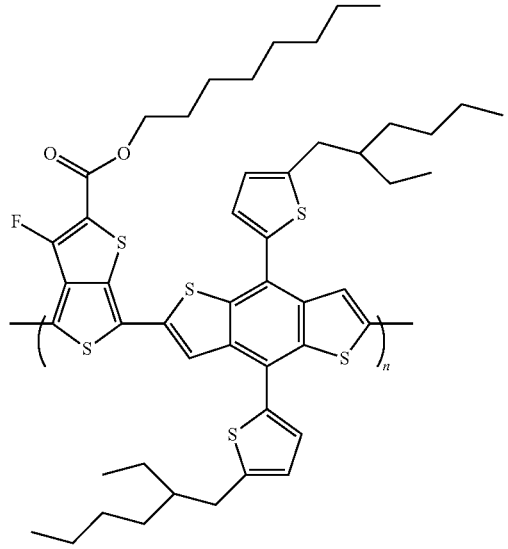

[70] PCBM: phenyl C71 butyric acid methyl ester

The photoelectric conversion efficiency in each of examples and comparative examples was determined from the following equation.

$$\eta(\%) = Isc\ (mA/cm^2) \times Voc(V) \times FF / \text{irradiation light intensity}(mW/cm^2) \times 100$$

$$FF = JV\max/(Isc\ (mA/cm^2) \times Voc(V))$$

JVmax (mW/cm$^2$) is a value of a product of a current density and an applied voltage at a point where the product of a current density and an applied voltage becomes the maximum within a range of the applied voltage from 0 V to the open circuit voltage.

The photoelectric conversion efficiency degradation ratio in each of examples and comparative examples was determined from the following equation.

Degradation ratio (%) = photoelectric conversion efficiency (%) after continuous light irradiation/ photoelectric conversion efficiency (%) immediately after start of light irradiation × 100

Synthesis Example 1

A compound A-1 was synthesized by a method shown in the following scheme.

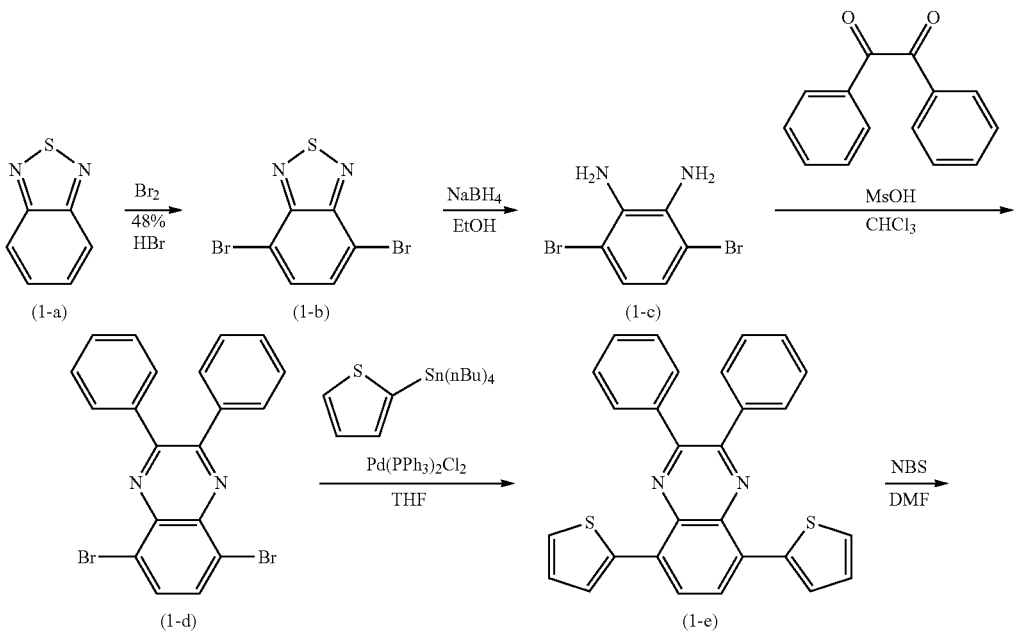
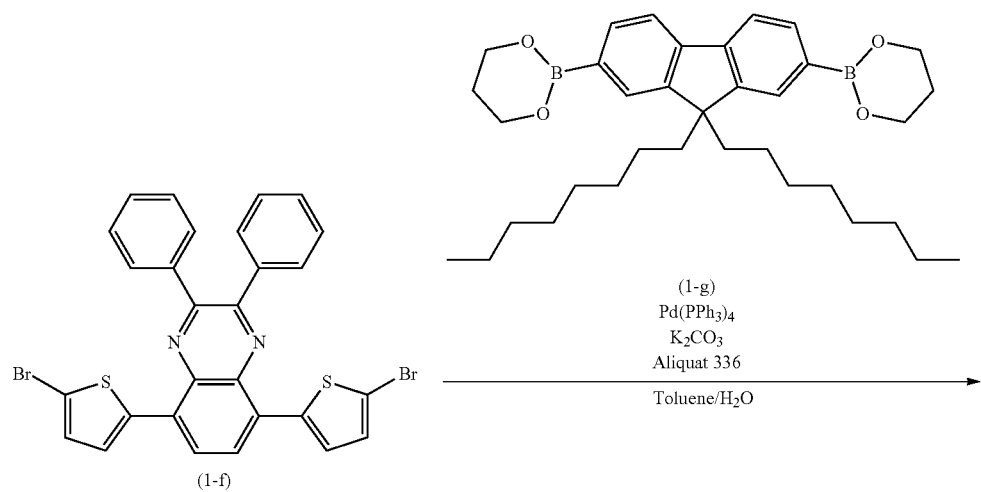
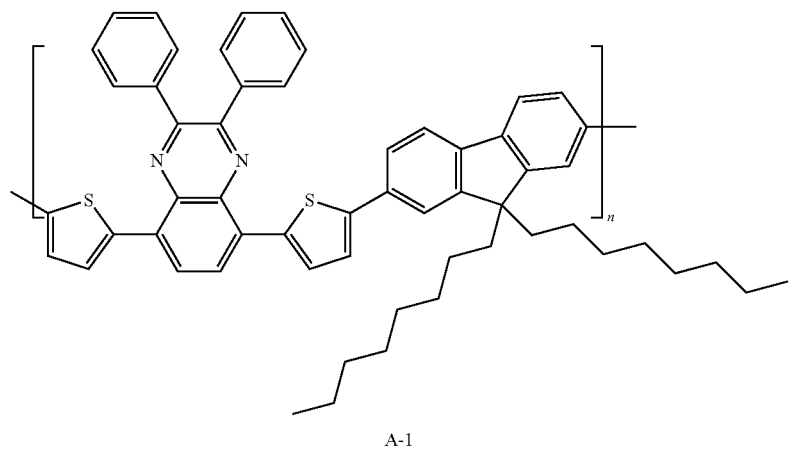

4.3 g of a compound (1-a) (manufactured by Tokyo Chemical Industry Co., Ltd.) and 10 g of bromine (manufactured by Wako Pure Chemical Industries, Ltd.) were added to 150 ml of 48% hydrobromic acid (manufactured by Wako Pure Chemical Industries, Ltd.), and the mixture stirred at 120° C. for 3 hours. The resulting product was cooled to room temperature, and the precipitated solid filtered by a glass filter, and washed with 1000 ml of water and 100 ml of acetone. The obtained solid was vacuum-dried at 60° C. to prepare 6.72 g of a compound (1-b).

5.56 g of the compound (1-b) was added to 180 ml of ethanol (manufactured by Wako Pure Chemical Industries, Ltd.), 13.2 g of NaBH$_4$ (manufactured by Wako Pure Chemical Industries, Ltd.) was added at 5° C. under a nitrogen atmosphere, and the mixture then stirred at room temperature for 2 days. The solvent was distilled away, 500 ml of water then added, and a solid taken by filtration, and washed with 1000 ml of water. The obtained solid was dissolved in 200 ml of diethyl ether, and the solution washed with 300 ml of water, and then dried with magnesium sulfate. The solvent was distilled away to prepare 2.37 g of a compound (1-c).

2.37 g of the compound (1-c) and 1.87 g of benzyl (manufactured by Wako Pure Chemical Industries, Ltd.) were added to 80 ml of chloroform, 3 drops of methanesulfonic acid (manufactured by Wako Pure Chemical Industries, Ltd.) added under a nitrogen atmosphere, and the mixture then heated and refluxed for 11 hours. The obtained solution was washed with a sodium hydrogen carbonate aqueous solution, and then dried with magnesium sulfate. The obtained solution was purified by column chromatography (filler: silica gel, eluent: chloroform), and washed with methanol to prepare 3.72 g of a compound (1-d).

1.0 g of the compound (1-d) and 1.87 g of tributyl(2-thienyl)tin (manufactured by Tokyo Chemical Industry Co., Ltd.) were added to 20 ml of tetrahydrofuran (manufactured by Wako Pure Chemical Industries, Ltd.), 32 mg of bis(triphenylphosphine)palladium dichloride (manufactured by Tokyo Chemical Industry Co., Ltd.) under a nitrogen atmosphere, and the mixture heated and refluxed for 5 hours. The resulting product was cooled to room temperature, 50 ml of methanol then added, and the precipitated sediment taken by filtration, and washed with methanol, water and methanol in this order. The obtained solid was purified by column chromatography (filler: silica gel, eluent: dichloromethane), and washed with methanol to prepare 693 mg of a compound (1-e).

693 mg of the compound (1-e) was dissolved in 80 ml of dimethylformamide (manufactured by Wako Pure Chemical Industries, Ltd.), 550 mg of N-bromosuccinimide (manufactured by Wako Pure Chemical Industries, Ltd.) added, and the mixture stirred at room temperature for 4 hours. To the obtained solution was added 250 ml of water, and the precipitated sediment taken by filtration, and washed with water and methanol in this order. The obtained solid was purified by column chromatography (filler: silica gel, eluent: dichloromethane), and washed with methanol to prepare 900 mg of a compound (1-f). $^1$H-NMR measurement results of the compound (1-f) are shown.

$^1$H-NMR (CDCl$_3$, ppm): 8.10 (s, 2H), 7.72-7.69 (m, 4H), 7.59 (d, 2H), 7.43-7.41 (m, 6H), 7.13 (d, 2H).

330 mg of the compound (1-f) and 304 mg of a compound (1-g) (manufactured by Aldrich Company) were dissolved in 70 ml of toluene. To this were added 20 ml of water, 1.51 g of potassium carbonate, 63 mg of tetrakis(triphenylphosphine)palladium (0) (manufactured by Tokyo Chemical Industry Co., Ltd.) and 2 drops of Aliquat 336 (manufactured by Aldrich Company), and the mixture stirred at 100° C. for 4.5 hours under a nitrogen atmosphere. 200 mg of bromobenzene (manufactured by Tokyo Chemical Industry Co., Ltd.) was then added, and the mixture stirred at 100° C. for 1 hour. 200 mg of phenylboronic acid (manufactured by Tokyo Chemical Industry Co., Ltd.) was then added, and the mixture stirred at 100° C. for 2 hours. To the obtained solution was added 200 ml of methanol, and a produced solid taken by filtration, and washed with methanol, acetone, water and acetone in this order. The obtained solid was added to 300 ml of acetone, and heated and refluxed for 30 minutes. The resulting product was filtered in a hot state, the obtained solid was dissolved in 300 ml of chloroform, the solution was made to pass through a silica gel short column (eluent: chloroform), and then concentrated, and the solid reprecipitated with methanol to prepare 354 mg of a compound A-1 (yield: 78%). The weight average molecular weight was 39500, the number average molecular weight was 16600, and the polymerization degree n was 47.4.

Synthesis Example 2

A compound A-2 was synthesized by a method shown in the following scheme. In Synthesis Example 2, a compound (2-i) was synthesized based on the method described in Journal of the American Chemical Society, 2009, Vol. 131, pages 7792-7799, and a compound (2-p) synthesized based on the method described in Angewandte Chemie International Edition, 2011, Vol. 50, pages 9697-9702.

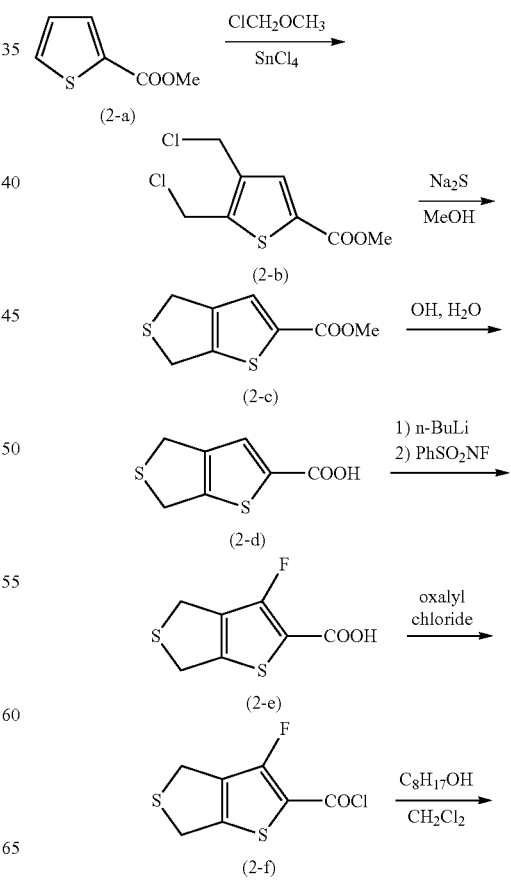

-continued
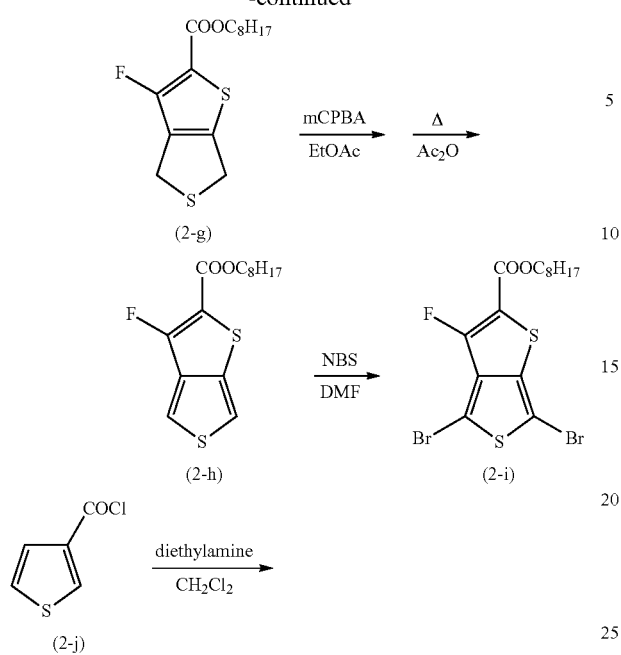
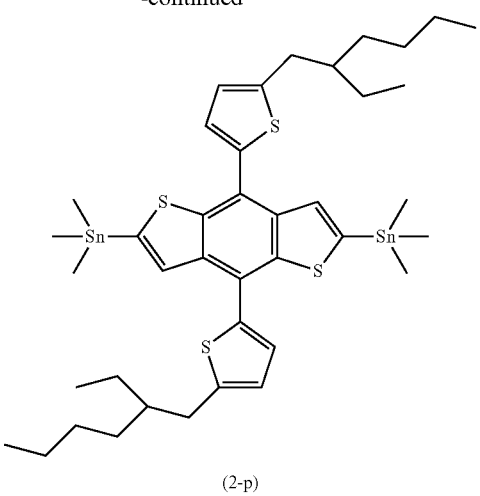
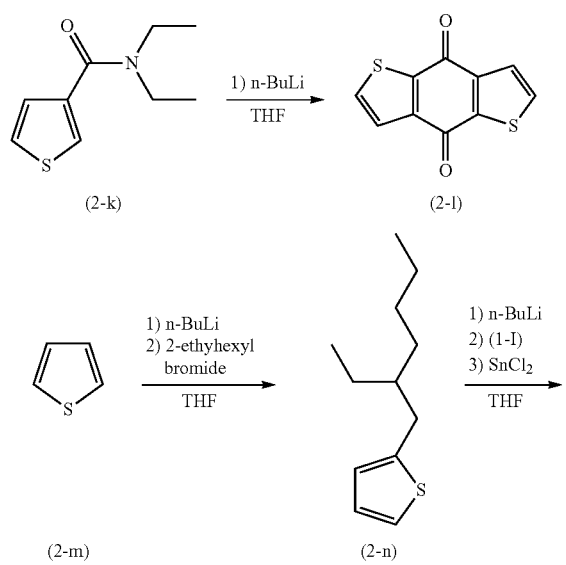
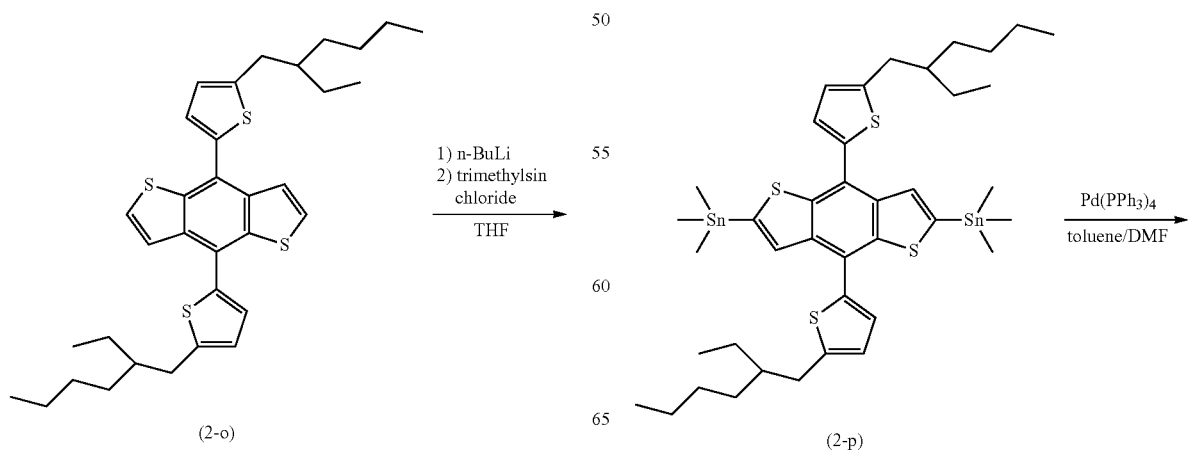

-continued

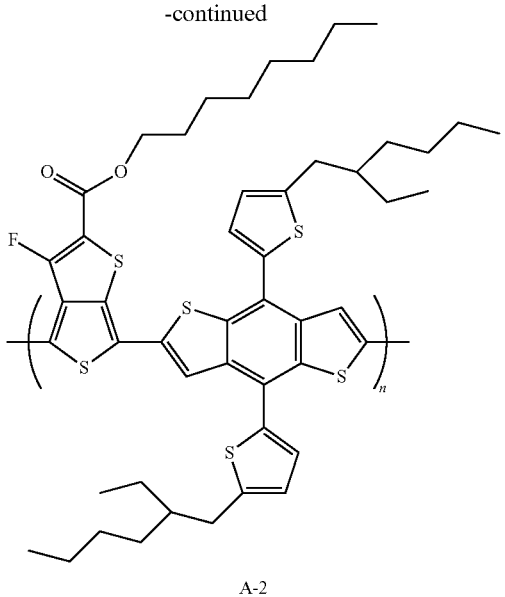

A-2

While 38 g (0.27 mol) of methyl-2-thiophene carboxylate (manufactured by Tokyo Chemical Industry Co., Ltd.) and 108 g (1.34 mol) of chloromethyl methyl ether (manufactured by Tokyo Chemical Industry Co., Ltd.) were stirred at 0° C., 125 g (0.48 mol) of tin tetrachloride (manufactured by Wako Pure Chemical Industries, Ltd.) was added thereto for 1 hour, and the mixture then stirred at room temperature for 8 hours. After completion of stirring, 100 ml of water was slowly added at 0° C., and the mixture extracted with chloroform three times. The organic layer was washed with a saturated saline solution, the solvent dried with anhydrous magnesium sulfate, and the solvent then removed under reduced pressure. The obtained brown solid was recrystallized from methanol to prepare a compound (2-b) as alight yellow solid (24.8 g, yield: 39%). $^1$H-NMR measurement results of the compound (2-b) are shown below.

$^1$H-NMR (270 MHz, CDCl$_3$): 7.71 (s, 1H), 4.79 (s, 1H), 4.59 (s, 1H), 3.88 (s, 3H) ppm.

24.8 g (0.10 mol) of the compound (2-b) was dissolved in 1.2 L of methanol (manufactured by SASAKI CHEMICAL INDUSTRY CO., LTD.). While the solution was stirred at 60° C., 100 ml of a methanol solution of 8.9 g (0.11 mol) of sodium sulfate (manufactured by Aldrich Company) was added dropwise thereto for 1 hour, and the mixture further stirred at 60° C. for 4 hours. After completion of the reaction, the solvent was removed under reduced pressure, 200 ml of chloroform and 200 ml of water were added, and insolubles separated by filtration. The organic layer was washed with water twice, and a saturated saline solution once, and dried with anhydrous magnesium sulfate, and the solvent then removed under reduced pressure. The crude product was purified by silica gel column chromatography (eluent: chloroform) to prepare a compound (2-c) as a white solid (9.8 g, yield: 48%). $^1$H-NMR measurement results of the compound (2-c) are shown below.

$^1$H-NMR (270 MHz, CDCl$_3$): 7.48 (s, 1H), 4.19 (t, J=3.0 Hz, 2H), 4.05 (t, J=3.0 Hz, 2H), 3.87 (s, 3H) ppm.

To 9.8 g (49 mmol) of the compound (2-c) were added 100 ml of water, and then 30 ml of a 3 M sodium hydroxide aqueous solution, and the mixture heated and stirred at 80° C. for 4 hours. After completion of the reaction, 15 ml of concentrated hydrochloric acid was added at 0° C., and the precipitated solid taken by filtration, and washed with water several times. The obtained solid was dried to prepare a compound (2-d) as a white solid (8.9 g, yield: 98%).

$^1$H-NMR (270 MHz, DMSO-d$_6$): 7.46 (s, 1H), 4.18 (t, J=3.2 Hz, 2H), 4.01 (t, J=3.2 Hz, 2H) ppm.

1.46 g (7.8 mmol) of the compound (2-d) was dissolved in 60 ml of dehydrated tetrahydrofuran (manufactured by Wako Pure Chemical Industries, Ltd.). While the solution was stirred at −78° C., 10.7 ml (17.2 mmol) of a normal butyllithium hexane solution (1.6 M, manufactured by Wako Pure Chemical Industries, Ltd.) was added dropwise thereto, and the mixture stirred at −78° C. for 1 hour. 20 ml of a dried tetrahydrofuran solution of 4.91 g (15.6 mmol) of N-fluorobenzenesulfonimide (manufactured by Tokyo Chemical Industry Co., Ltd.) was then added dropwise at −78° C. for 10 minutes, and the mixture stirred at room temperature for 12 hours. After completion of the reaction, 50 ml of water was slowly added. The aqueous layer was made acidic by adding 3 M hydrochloric acid, and then extracted three times with chloroform. The organic layer was dried with anhydrous magnesium sulfate, and the solvent then distilled away under reduced pressure. Byproducts were removed by silica gel column chromatography (eluent: ethyl acetate), and recrystallization then performed from ethyl acetate to prepare a compound (2-e) as a light yellow powder (980 mg, yield: 61%). $^1$H-NMR measurement results of the compound (2-e) are shown below.

$^1$H-NMR (270 MHz, DMSO-d$_6$): 13.31 (brs, 1H), 4.20 (t, J=3.0 Hz, 2H), 4.03 (t, J=3.0 Hz, 2H) ppm.

To 10 ml of a dehydrated dichloromethane (manufactured by Wako Pure Chemical Industries, Ltd.) solution of 800 mg (3.9 mmol) of the compound (2-e) were added 1 ml of oxalyl chloride (manufactured by Tokyo Chemical Industry Co., Ltd.), and then 1 drop of dimethylformamide (manufactured by Wako Pure Chemical Industries, Ltd.), and the mixture stirred at room temperature for 3 hours. The solvent and excess oxalyl chloride were removed under reduced pressure to prepare a compound (2-f) as a yellow oil. The compound (2-f) was used as it in the subsequent reaction.

10 ml of a dichloromethane solution of the compound (2-f, crude product) was added to 15 ml of a dichloromethane solution of 1.3 g (10 mmol) of 1-octanol (manufactured by Wako Pure Chemical Industries, Ltd.) and 800 mg (8 mmol) of triethyl amine (manufactured by Wako Pure Chemical Industries, Ltd.) at room temperature, and the mixture stirred at room temperature for 6 hours. The reaction solution was washed with 1 M hydrochloric acid twice, water once, and a saturated saline solution once, and dried with anhydrous magnesium sulfate, and the solvent then distilled away under reduced pressure. The resulting product was purified by silica gel column chromatography (eluent: chloroform) to prepare a compound (2-g) as a light yellow solid (1.12 g, yield: 90%). $^1$H-NMR measurement results of the compound (2-g) are shown below.

$^1$H-NMR (270 MHz, CDCl$_3$): 4.27 (t, J=6.7 Hz, 2H), 4.16 (t, J=3.0 Hz, 2H), 4.01 (t, J=3.0 Hz, 2H), 1.72 (m, 2H), 1.5-1.3 (m, 12H), 0.88 (t, J=7.0 Hz, 3H) ppm.

To 40 ml of an ethyl acetate solution of 1.1 g (3.5 mmol) of the compound (2-g) was added dropwise 10 ml of an ethyl acetate solution of 630 mg (3.6 mmol) of meta-chloroperoxybenzoic acid (manufactured by nacalai tesque) at 0° C., and the mixture stirred at room temperature for 5 hours. The solvent was removed under reduced pressure, 30 ml of acetic anhydride then added, and the mixture heated and refluxed for 3 hours. The solvent was removed under reduced pressure again, and the resulting product purified by silica gel column chromatography (eluent: dichloromethane:

hexane=1:1) to prepare a compound (2-h) as a light yellow oil (1.03 g, yield: 94%). $^1$H-NMR measurement results of the compound (1-h) are shown below.

$^1$H-NMR (270 MHz, CDCl$_3$): 7.65 (d, J=2.7 Hz, 1H), 7.28 (dd, J=2.7 Hz and 5.4 Hz, 1H), 4.31 (t, J=6.8 Hz, 2H), 1.75 (m, 2H), 1.42-1.29 (m, 12H), 0.89 (t, J=6.8 Hz, 3H) ppm.

To 20 ml of a dimethylformamide solution of 1.0 g (3.2 mmol) of the compound (2-h) was added 1.25 g (7.0 mmol) of N-bromosuccinimide (manufactured by Wako Pure Chemical Industries, Ltd.) at room temperature, and the mixture stirred at room temperature for 3 hours. After completion of the reaction, 10 ml of a 5% sodium thiosulfate aqueous solution was added, and the mixture stirred for 5 minutes. 80 ml of ethyl acetate was added, the organic layer washed with water five times, and a saturated saline solution once, and dried with anhydrous magnesium sulfate, and the solvent then distilled away under reduced pressure. The resulting product was purified by silica gel column chromatography (eluent: chloroform:hexane=1:3) to prepare a compound (2-i) as a light yellow solid (1.2 g, yield: 79%). $^1$H-NMR measurement results of the compound (2-i) are shown below.

$^1$H-NMR (270 MHz, CDCl$_3$): 4.32 (t, J=6.5 Hz, 2H), 1.75 (m, 2H), 1.42-1.29 (m, 12H), 0.89 (t, J=6.8 Hz, 3H) ppm.

To 300 ml of a dichloromethane solution of 110 g (1.5 mol) of diethylamine (manufactured by Wako Pure Chemical Industries, Ltd.) was added 100 g (0.68 mol) of 3-thiophenecarbonyl chloride (manufactured by Wako Pure Chemical Industries, Ltd.) at 0° C. for 1 hour, and the mixture stirred at room temperature for 3 hours. After completion of stirring, 200 ml of water was added, and the organic layer washed with water three times, and a saturated saline solution once. The resulting product was dried with anhydrous magnesium sulfate, and the solvent then distilled away under reduced pressure. The residues were distilled under reduced pressure to prepare a compound (2-k) as a light orange liquid (102 g, yield: 82%). $^1$H-NMR measurement results of the compound (2-k) are shown below.

$^1$H-NMR (270 MHz, CDCl$_3$): 7.47 (dd, J=3.2 Hz and 1.0 Hz, 1H), 7.32 (dd, J=5.0 Hz and 3.2 Hz, 1H), 7.19 (dd, J=5.0 Hz and 1.0 Hz, 1H), 3.43 (brs, 4H), 1.20 (t, J=6.5 Hz, 6H) ppm.

To 400 ml of a dehydrated tetrahydrofuran (manufactured by Wako Pure Chemical Industries, Ltd.) solution of 73.3 g (0.40 mol) of the compound (2-k) was added dropwise 250 ml (0.40 mol) of a normal butyllithium hexane solution (1.6 M, manufactured by Wako Pure Chemical Industries, Ltd.) at 0° C. for 30 minutes. After completion of dropwise addition, the mixture was stirred at room temperature for 4 hours. After completion of stirring, 100 ml of water was slowly added, the mixture stirred for a while, and the reaction mixture then poured into 800 ml of water. The precipitated solid was taken by filtration, and washed with water, methanol and hexane in this order to prepare a compound (2-l) as a yellow solid (23.8 g, yield: 27%). $^1$H-NMR measurement results of the compound (2-l) are shown below.

$^1$H-NMR (270 MHz, CDCl$_3$): 7.69 (d, J=4.9 Hz, 2H), 7.64 (d, J=4.9 Hz, 2H) ppm.

To 400 ml of a dehydrated tetrahydrofuran (manufactured by Wako Pure Chemical Industries, Ltd.) solution of 42 g (0.50 mol) of thiophene was added dropwise 250 ml (0.40 mol) of a normal butyllithium hexane solution (1.6 M, manufactured by Wako Pure Chemical Industries, Ltd.) at −78° C. for 30 minutes. The reaction mixture was stirred at −78° C. for 1 hour, and 76.4 g (0.40 mol) of 2-ethylhexyl bromide (manufactured by Wako Pure Chemical Industries, Ltd.) then added dropwise at −78° C. for 15 minutes. The reaction solution was stirred at room temperature for 30 minutes, and then heated and stirred at 60° C. for 6 hours. After completion of stirring, the reaction solution was cooled to room temperature, and 200 ml of water and 200 ml of ether added. The organic layer was washed with water twice, and a saturated saline solution, and then dried with anhydrous magnesium sulfate, and the solvent distilled away under reduced pressure. The residues were distilled under reduced pressure to prepare a compound (2-n) as a colorless liquid (28.3 g, 36%). $^1$H-NMR measurement results of the compound (2-n) are shown below.

$^1$H-NMR (270 MHz, CDCl$_3$): 7.11 (d, 4.9 Hz, 1H), 6.92 (dd, 4.9 Hz and 3.2 Hz, 1H), 6.76 (d, J=3.2 Hz, 1H), 2.76 (d, J=6.8 Hz, 2H), 1.62 (m, 1H), 1.4-1.3 (m, 8H), 0.88 (m, 6H) ppm.

To 400 ml of a dehydrated tetrahydrofuran (manufactured by Wako Pure Chemical Industries, Ltd.) solution of 17.5 g (89 mmol) of the compound (2-n) was added dropwise 57 ml (89 mmol) of a normal butyllithium hexane solution (1.6 M, manufactured by Wako Pure Chemical Industries, Ltd.) at 0° C. for 30 minutes. The reaction solution was stirred at 50° C. for 1 hour, 4.9 g (22 mmol) of the compound (2-l) then added at 50° C., and the mixture stirred for 1 hour. After completion of stirring, the reaction solution was cooled to 0° C., a solution obtained by dissolving 39.2 g (175 mmol) of tin chloride dihydrate (manufactured by Wako Pure Chemical Industries, Ltd.) in 80 ml of 10% hydrochloric acid was added, and the mixture stirred at room temperature for 1 hour. After completion of stirring, 200 ml of water and 200 ml of diethyl ether were added, and the organic layer washed with water twice, and a saturated saline solution. The resulting product was dried with anhydrous magnesium sulfate, and the solvent then distilled away under reduced pressure. The resulting product was purified by silica gel column chromatography (eluent: hexane) to prepare a compound (2-o) as a yellow oil (7.7 g, yield: 59%). $^1$H-NMR measurement results of the compound (2-o) are shown below.

$^1$H-NMR (270 MHz, CDCl$_3$): 7.63 (d, J=5.7 Hz, 1H), 7.45 (d, J=5.7 Hz, 1H), 7.29 (d, J=3.6 Hz, 1H), 6.88 (d, J=3.6 Hz, 1H), 2.86 (d, J=7.0 Hz, 2H), 1.70-1.61 (m, 1H), 1.56-1.41 (m, 8H), 0.97-0.89 (m, 6H) ppm.

To 25 ml of a dehydrated tetrahydrofuran (manufactured by Wako Pure Chemical Industries, Ltd.) solution of 870 mg (1.5 mmol) of the compound (2-o) was added 2.0 ml (3.3 mmol) of a normal butyllithium hexane solution (1.6 M, manufactured by Wako Pure Chemical Industries, Ltd.) at −78° C. using a syringe, and the mixture was stirred at −78° C. for 30 minutes and at room temperature for 30 minutes. The reaction mixture was cooled to −78° C., 800 mg (4.0 mmol) of trimethyltin chloride (manufactured by Wako Pure Chemical Industries, Ltd.) then added at −78° C. at one time, and the mixture stirred at room temperature for 4 hours. After completion of stirring, 50 ml of diethyl ether and 50 ml of water were added, the mixture stirred at room temperature for 5 minutes, and the organic layer then washed with water twice, and then a saturated saline solution. The solvent was dried with anhydrous sodium sulfate, and the solvent then distilled away under reduced pressure. The obtained orange oil was recrystallized from ethanol to prepare a compound (2-p) as a light yellow solid (710 mg, yield: 52%). $^1$H-NMR measurement results of the compound (2-p) are shown below.

$^1$H-NMR (270 MHz, CDCl$_3$): 7.68 (s, 2H), 7.31 (d, J=3.2 Hz, 2H), 6.90 (d, J=3.2 Hz, 2H), 2.87 (d, J=6.2 Hz, 4H), 1.69 (m, 2H), 1.40-1.30 (m, 16H), 1.0-0.9 (m, 12H), 0.39 (s, 18H) ppm.

71 mg (0.15 mmol) of the compound (2-i) and 136 mg (0.15 mmol) of the compound (2-p) were dissolved in 4 ml of toluene (manufactured by Wako Pure Chemical Industries, Ltd.) and 1 ml of dimethylformamide (manufactured by Wako Pure Chemical Industries, Ltd.). To the resulting solution was added 5 mg of tetrakistriphenylphosphinepalladium (manufactured by Tokyo Chemical Industry Co., Ltd.), and the mixture stirred at 100° C. for 15 hours under a nitrogen atmosphere. 15 mg of bromobenzene (manufactured by Tokyo Chemical Industry Co., Ltd.) was then added, and the mixture stirred at 100° C. for 1 hour. 40 mg of tributyl(2-thienyl)tin (manufactured by Tokyo Chemical Industry Co., Ltd.) was then added, and the mixture further stirred at 100° C. for 1 hour. After completion of stirring, the reaction mixture was cooled to room temperature, and poured into 100 ml of methanol. The precipitated solid was taken by filtration, and washed with methanol, water and acetone in this order. The solid was then washed with acetone and hexane in this order using a Soxhlet extractor. Next, the obtained solid was dissolved in chloroform, and made to pass through Celite (manufactured by nacalai tesque), and then a silica gel column (eluent: chloroform), and the solvent was then distilled away under reduced pressure. The obtained solid was dissolved in chloroform again, and then reprecipitated in methanol to obtain a compound A-2 (85 mg).

Example 1

0.5 mL of an ethanol solvent (manufactured by Wako Pure Chemical Industries, Ltd.) was added in a sample bottle containing 10 mg of zinc acetate dihydrate (manufactured by Wako Pure Chemical Industries, Ltd.), and the zinc acetate dihydrate heat-dissolved in the solvent to prepare a solution A. To the solution A was added 3-aminopropyltriethoxysilane (manufactured by Aldrich Company) at a ratio of 1% by volume to prepare a solution B.

0.15 mL of a chlorobenzene solvent (manufactured by Wako Pure Chemical Industries, Ltd.) was added in a sample bottle containing 0.6 mg of the compound A-1 and 2.4 mg of [70]PCBM (manufactured by Solenne Company), and ultrasonic wave irradiation performed for 30 minutes in an ultrasonic wave washing machine (US-2 manufactured by Iuchi Seieido Co., Ltd., power: 120 W) to prepare a solution C.

A glass substrate, on which an ITO transparent electrically conductive layer as a cathode was deposited in a thickness of 125 nm by a sputtering method, was cut to 38 mm×46 mm, and ITO then patterned in an oblong shape of 38 mm×13 mm by a photolithography method. Light transmittance of the obtained substrate was measured by Spectrophotometer U-3010 manufactured by Hitachi, Ltd., and the result showed that light transmittance was 85% or more in the whole of the wavelength range of 400 nm to 900 nm. The substrate was subjected to ultrasonic cleaning with an alkali cleaning solution ("Semicoclean" EL56 manufactured by Furuuchi Chemical Corporation) for 10 minutes, and then washed with ultrapure water. The substrate was subjected to an UV/ozone treatment for 30 minutes, and the solution B then added dropwise onto the ITO layer, applied at 3000 rpm by a spin coating method, and heat-treated on a hot plate at 100° C. for 30 minutes to form an electron extraction layer having a thickness of about 10 nm. The solution C was then added dropwise onto the electron extraction layer, and a photoelectric conversion layer having a thickness of 100 nm formed by a spin coating method. The substrate and a mask for the hole extraction layer was placed in a vacuum vapor deposition apparatus, the inside of the apparatus evacuated to a pressure of 1×10$^{-3}$ Pa or less, a layer of molybdenum trioxide (MoO$_3$ manufactured by Luminescence Technology Corporation) vapor-deposited in a thickness of 10 nm, and subsequently a silver layer as a cathode vapor-deposited in a thickness of 100 nm by a resistance heating method. Extraction electrodes were taken out from the upper and lower electrodes of the prepared element to prepare a photovoltaic element in which the area of a part with the belt-shaped ITO layer and the silver layer overlapping each other was 5 mm×5 mm.

The positive electrode and the negative electrode of the photovoltaic element thus prepared were connected to Series 2400 SourceMeter manufactured by Keithley Company, the photovoltaic element was irradiated with simulated sunlight (OTENTO-SUNIII manufactured by Bunkoukeiki Co., Ltd., spectral shape: AM1.5, intensity: 100 mW/cm$^2$) from the ITO layer side in the air, and a current value measured while the applied voltage was changed from −1 V to +2 V. Next, the photovoltaic element was heat-treated on a hot plate at 110° C. for 1 hour under nitrogen, and current-voltage characteristics in irradiation of light measured in the same manner as described above.

The photoelectric conversion efficiency (η) was calculated from the obtained current value, and the result showed that the retention ratio of the photoelectric conversion efficiency after the heat treatment was 101%.

Example 2

To 0.5 mL of an ethanol solvent (manufactured by Wako Pure Chemical Industries, Ltd.) was added 3-aminopropyltriethoxysilane (manufactured by Aldrich Company) at a ratio of 1% by volume to prepare a solution D.

Except that instead of the solution B, the solution A was applied onto the ITO layer, and heat-treated at 200° C. for 30 minutes, and the solution D then applied by a spin coating method at 3000 rpm, and heat-treated at 100° C. for 30 minutes to form an electrode extraction layer, exactly the same procedure as in Example 1 was carried out to prepare an element and perform measurement.

The photoelectric conversion efficiency (η) was calculated from the obtained current value, and the result showed that the retention ratio of the photoelectric conversion efficiency after the heat treatment was 101%.

Example 3

To 0.5 mL of an ethanol solvent (manufactured by Wako Pure Chemical Industries, Ltd.) was added [3-(N,N-dimethylamino)propyl]trimethoxysilane (manufactured by Tokyo Chemical Industry Co., Ltd.) at a ratio of 0.1% by volume to prepare a solution E.

Except that instead of the solution B, the solution E was applied onto the ITO layer, exactly the same procedure as in Example 1 was carried out to prepare an element and perform measurement.

The photoelectric conversion efficiency (η) was calculated from the obtained current value, and the result showed that the retention ratio of the photoelectric conversion efficiency after the heat treatment was 105%.

Comparative Example 1

Except that instead of the solution B, the solution A was applied onto the ITO layer, and heat-treated at 200° C. for 30 minutes to prepare an electron extraction layer, exactly the same procedure as in Example 1 was carried out to prepare an element and perform measurement.

The photoelectric conversion efficiency (η) was calculated from the obtained current value, and the result showed that the retention ratio of the photoelectric conversion efficiency after the heat treatment was 92%.

Comparative Example 2

To the solution A was added monoethanolamine (manufactured by Tokyo Chemical Industry Co., Ltd.) at a ratio of 1% by volume to prepare a solution F.

Except that instead of the solution B, the solution F was used, exactly the same procedure as in Example 1 was carried out to prepare an element and perform measurement.

The photoelectric conversion efficiency (η) was calculated from the obtained current value, and the result showed that the retention ratio of the photoelectric conversion efficiency after the heat treatment was 95%.

Example 4

To 0.5 mL of a dehydrated isopropyl alcohol solvent (manufactured by Wako Pure Chemical Industries, Ltd.) was added tetraisopropyl orthotitanate (manufactured by Wako Pure Chemical Industries, Ltd.) at a ratio of 0.1% by volume to prepare a solution G.

Except that instead of the solution B, the solution G was applied onto the ITO layer, and heat-treated at 200° C. for 30 minutes, and the solution D then applied by a spin coating method at 3000 rpm, and heat-treated at 100° C. for 30 minutes to form an electrode extraction layer, exactly the same procedure as in Example 1 was carried out to prepare an element and perform measurement.

The photoelectric conversion efficiency (η) was calculated from the obtained current value, and the result showed that the retention ratio of the photoelectric conversion efficiency after the heat treatment was 97%.

Comparative Example 3

Except that the solution D was not applied, exactly the same procedure as in Example 4 was carried out to prepare an element and perform measurement.

The photoelectric conversion efficiency (η) was calculated from the obtained current value, and the result showed that the retention ratio of the photoelectric conversion efficiency after the heat treatment was 94%.

Example 5

0.2 mL of a chloroform solution (manufactured by nacalai tesque) containing 2% by volume of 1,8-diiodooctane (manufactured by Tokyo Chemical Industry Co., Ltd.) was added in a sample bottle containing 0.9 mg of the compound A-2 and 1.1 mg of [70] PCBM (manufactured by Sorenu Company), and further, ultrasonic wave irradiation performed for 30 minutes in an ultrasonic wave washing machine (US-2 manufactured by Iuchi Seieido Co., Ltd., power: 120 W) to prepare a solution H.

A glass substrate, on which an ITO transparent electrically conductive layer as a cathode was deposited in a thickness of 125 nm by a sputtering method, was cut to 38 mm×46 mm, and ITO then patterned in an oblong shape of 38 mm×13 mm by a photolithography method. The light transmittance of the obtained substrate was measured by Spectrophotometer U-3010 manufactured by Hitachi, Ltd., and the result showed that light transmittance was 85% or more in the whole of the wavelength range of 400 nm to 900 nm. The substrate was subjected to ultrasonic cleaning with an alkali cleaning solution ("Semicoclean" EL56 manufactured by Furuuchi Chemical Corporation) for 10 minutes, and then washed with ultrapure water. The substrate was subjected to a UV/ozone treatment for 30 minutes, and the solution B then added dropwise onto the ITO layer, applied at 3000 rpm by a spin coating method, and heat-treated on a hot plate at 100° C. for 30 minutes to form an electron extraction layer having a thickness of about 10 nm. The solution H was then added dropwise onto the electron extraction layer, and a photoelectric conversion layer having a thickness of 120 nm was formed by a spin coating method. The substrate and a mask for the hole extraction layer was placed in a vacuum vapor deposition apparatus, the inside of the apparatus evacuated to a pressure of $1 \times 10^{-3}$ Pa or less, a layer of tungsten trioxide ($WO_3$ manufactured by Wako Pure Chemical Industries, Ltd.) vapor-deposited in a thickness of 10 nm, and subsequently a silver layer as a cathode was vapor-deposited in a thickness of 100 nm by a resistance heating method. Extraction electrodes were taken out from the upper and lower electrodes of the prepared element to prepare a photovoltaic element in which the area of a part with the belt-shaped ITO layer and the silver layer overlapping each other was 5 mm×5 mm.

The positive electrode and the negative electrode of the photovoltaic element thus prepared were connected to Series 2400 SourceMeter manufactured by Keithley Company, the photovoltaic element irradiated with simulated sunlight (OTENTO-SUNIII manufactured by Bunkoukeiki Co., Ltd., spectral shape: AM1.5, intensity: 100 mW/cm$^2$) from the ITO layer side in the air, and a current value measured while the applied voltage was changed from −1 V to +2 V. Next, the photovoltaic element was heat-treated on a hot plate at 100° C. for 2 hours under nitrogen, and current-voltage characteristics in irradiation of light were measured in the same manner as described above.

The photoelectric conversion efficiency (η) was calculated from the obtained current value, and the result showed that the retention ratio of the photoelectric conversion efficiency after the heat treatment was 86%.

Example 6

Except that instead of the solution B, the solution A was applied onto the ITO layer, and heat-treated at 100° C. for 30 minutes, and the solution D then applied by a spin coating method at 3000 rpm, and heat-treated at 100° C. for 30 minutes to form an electrode extraction layer, exactly the same procedure as in Example 5 was carried out to prepare an element and perform measurement.

The photoelectric conversion efficiency (η) was calculated from the obtained current value, and the result showed that the retention ratio of the photoelectric conversion efficiency after the heat treatment was 88%.

Example 7

To the solution A was added 3-(2-aminoethylamino)propyltriethoxysilane (manufactured by Tokyo Chemical Industry Co., Ltd.) at a ratio of 0.5% by volume to prepare a solution I.

Except that instead of the solution B, the solution I was used, exactly the same procedure as in Example 5 was carried out to prepare an element and perform measurement.

The photoelectric conversion efficiency (η) was calculated from the obtained current value, and the result showed that the retention ratio of the photoelectric conversion efficiency after the heat treatment was 93%.

Example 8

To the solution A was added triethoxy-3-(2-imidazoline-1-yl)propylsilane (manufactured by Aldrich Company) at a ratio of 0.5% by volume to prepare a solution J.

Except that instead of the solution B, the solution J was used, exactly the same procedure as in Example 5 was carried out to prepare an element and perform measurement.

The photoelectric conversion efficiency (η) was calculated from the obtained current value, and the result showed that the retention ratio of the photoelectric conversion efficiency after the heat treatment was 85%.

Comparative Example 4

Except that instead of the solution B, the solution A was applied onto the ITO layer, and heat-treated at 100° C. for 30 minutes to prepare an electron extraction layer, exactly the same procedure as in Example 5 was carried out to prepare an element and perform measurement.

The photoelectric conversion efficiency (η) was calculated from the obtained current value, and the result showed that the retention ratio of the photoelectric conversion efficiency after the heat treatment was 20%.

Comparative Example 5

Except that instead of the solution B, the solution F was used, exactly the same procedure as in Example 5 was carried out to prepare an element and perform measurement.

The photoelectric conversion efficiency (η) was calculated from the obtained current value, and the result showed that the retention ratio of the photoelectric conversion efficiency after the heat treatment was 76%.

TABLE 1

| | Precursor of inorganic compound (A) | Organic compound (B) | Bonding group | Electron-donating group | Mixed type/ laminated type | Heat treatment | Isc (mA/cm2) | Voc (V) | FF | η (%) | Conversion efficiency retention ratio (%) |
|---|---|---|---|---|---|---|---|---|---|---|---|
| Example 1 | Zinc acetate | Aminopropyl-triethoxysilane | Silyl group | Amino group | Mixed type | None | 8.0 | 0.95 | 0.592 | 4.52 | — |
| | | | | | | 110° C. 1 h | 8.0 | 0.99 | 0.575 | 4.57 | 101% |
| Example 2 | Zinc acetate | Aminopropyl-triethoxysilane | Silyl group | Amino group | Laminated type | None | 8.1 | 0.96 | 0.581 | 4.51 | — |
| | | | | | | 110° C. 1 h | 8.1 | 0.99 | 0.567 | 4.56 | 101% |
| Example 3 | Zinc acetate | [3-(N,N-dimethyl-amino)propyl]tri-methoxysilane | Silyl group | Amino group | Mixed type | None | 8.1 | 0.94 | 0.566 | 4.31 | — |
| | | | | | | 110° C. 1 h | 8.2 | 0.97 | 0.567 | 4.52 | 105% |
| Comparative Example 1 | Zinc acetate | — | — | — | — | None | 8.1 | 0.95 | 0.592 | 4.54 | — |
| | | | | | | 110° C. 1 h | 7.8 | 0.98 | 0.552 | 4.19 | 92% |
| Comparative Example 2 | Zinc acetate | Monoethanol-amine | (Hydrogen bond) | Amino group | — | None | 8.0 | 0.95 | 0.578 | 4.41 | — |
| | | | | | | 110° C. 1 h | 8.1 | 0.94 | 0.551 | 4.20 | 95% |
| Example 4 | Tetraisopropyl orthotitanate | Aminopropyl-triethoxysilane applied | Silyl group | Amino group | Laminated type | None | 7.5 | 0.93 | 0.542 | 3.79 | — |
| | | | | | | 110° C. 1 h | 7.3 | 0.96 | 0.522 | 3.67 | 97% |
| Comparative Example 3 | Tetraisopropyl orthotitanate | — | — | — | — | None | 7.7 | 0.90 | 0.524 | 3.65 | — |
| | | | | | | 110° C. 1 h | 7.6 | 0.86 | 0.524 | 3.44 | 94% |

TABLE 2

| | Precursor of inorganic compound (A) | Organic compound (B) | Bonding group | Electron-donating group | Mixed type/ laminated type | Heat treatment | Isc (mA/cm2) | Voc (V) | FF | η (%) | Conversion efficiency retention ratio (%) |
|---|---|---|---|---|---|---|---|---|---|---|---|
| Example 5 | Zinc acetate | Aminopropyl-triethoxysilane | Silyl group | Amino group | Mixed type | None | 15.5 | 0.76 | 0.708 | 8.36 | — |
| | | | | | | 100° C. 2 h | 14.4 | 0.78 | 0.639 | 7.19 | 86% |
| Example 6 | Zinc acetate | Aminopropyl-triethoxysilane | Silyl group | Amino group | Laminated type | None | 15.4 | 0.76 | 0.697 | 8.14 | — |
| | | | | | | 100° C. 2 h | 14.4 | 0.78 | 0.639 | 7.16 | 88% |
| Example 7 | Zinc acetate | 3-(2-Aminoethyl-amino)propyl-triethoxysilane | Silyl group | Amino group | Mixed type | None | 15.5 | 0.73 | 0.704 | 7.95 | — |
| | | | | | | 100° C. 2 h | 14.8 | 0.79 | 0.630 | 7.36 | 93% |
| Example 8 | Zinc acetate | Triethoxy-3-(2-imidazoline-1-yl)propylsilane | Silyl group | Amino group | Mixed type | None | 16.0 | 0.74 | 0.697 | 8.22 | — |
| | | | | | | 100° C. 2 h | 14.7 | 0.78 | 0.610 | 7.00 | 85% |
| Comparative Example 4 | Zinc acetate | — | — | — | — | None | 14.4 | 0.75 | 0.700 | 7.54 | — |
| | | | | | | 100° C. 2 h | 10.9 | 0.32 | 0.430 | 1.50 | 20% |
| Comparative Example 5 | Zinc acetate | Monoethanolamine | (Hydrogen bond) | Amino group | — | None | 14.7 | 0.75 | 0.693 | 7.63 | — |
| | | | | | | 100° C. 2 h | 13.6 | 0.78 | 0.550 | 5.82 | 76% |

The results in examples and comparative examples are collectively shown in Tables 1 and 2. Table 1 corresponds to when the compound A-1 is used as an electron-donating organic semiconductor, and Table 2 corresponds to when the compound A-2 is used as an electron-donating organic semiconductor. Comparisons between Examples 1 to 3 and Comparative Examples 1 and 2, between Example 4 and Comparative Example 3, and between Examples 5 to 8 and Comparative Examples 4 and 5 show that the heat resistance performance of the photovoltaic element can be improved by our methods.

The invention claimed is:

1. A method of producing an electron extraction layer comprising:
    preparing a solution in which a precursor of an inorganic compound (A) and an organic compound (B) having an electron-donating group and a bonding functional group are mixed and dissolved,
    forming a layer by applying the solution on a cathode or a photoelectric conversion layer, and
    concurrently 1) converting the precursor of the inorganic compound (A) into the inorganic compound (A) and 2) bonding the bonding functional group of the organic compound (B) to the inorganic compound (A) after forming the layer,
    wherein the organic compound (B) having an electron-donating group and a bonding functional group is selected from the group consisting of 3-aminopropyltriethoxysilane, 3-aminopropyltrimethoxysilane, 3-aminopropyldiethoxymethylsilane, 3-(2-aminoethylamino)propyltrimethoxysilane, 3-(2-aminoethylamino)propyldimethoxymethylsilane, 3-(2-aminoethylamino)propyltriethoxysilane, trimethoxy[3-(phenylamino)propyl]silane, trimethoxy[3-(methylamino)propyl]silane, 3-glycidyloxypropyltrimethoxysilane, decyltrichlorosilane, dodecyltriethoxysilane, octadecyltriethoxysilane, methanesulfonyl chloride, ethanesulfonyl chloride, isopropylsulfonyl chloride, 1-butanesulfonyl chloride, cyclopropanesulfonyl chloride, 4-methoxybenzenesulfonyl chloride, 4-isopropoxybenzenesulfonyl chloride, 2-thiophenesulfonyl chloride, pyridine-3-sulfonylchloride, 4-methoxybenzoic acid, 4-methoxybenzoyl chloride, 4-methoxyphenylphosphonic acid, decylphosphonic acid, octadecylphosphonic acid, 4-methoxyphenyl dichlorophosphate, 4-aminobenzenethiol, 2,3-butanedithiol, 1-butanethiol, 2-butanethiol, cyclohexanethiol, cyclopentanethiol, 1-decanethiol and 4-(dimethylamino)benzenethiol.

2. The method according to claim 1, wherein the inorganic compound (A) is an inorganic oxide having n-type semiconductor characteristics.

3. The method according to claim 1, wherein the inorganic oxide (A) is an oxide of a metal selected from the group consisting of zinc, titanium, tin and indium.

4. The method according to claim 1, wherein the precursor of an inorganic compound (A) is a metal compound which is oxidized by heating.

5. The method according to claim 1, wherein the precursor of an inorganic compound (A) is a metal salt or metal alkoxide.

6. The method according to claim 1, wherein the precursor of an inorganic compound (A) is selected from the group consisting of zinc acetate dihydrate, zinc formate, zinc acetate, zinc propionate, zinc butyrate, zinc oxalate, zinc acetylacetonate, bis[2-(2-benzothiazolyl)phenolate]zinc, bis[2-(2-benzoxazolyl)phenolate]zinc, bis(8-quinolinolato)zinc, ammonium metavanadate, ammonium molybdate, ammonium hexafluorozirconate, sodium tungstate, ammonium tetrachlorozincate, tetraisopropyl orthotitanate, lithium nickelate, potassium permanganate, silver phenanthroline complexes, AgTCNQ, titanium alkoxide compounds, bis(2,4-pentanedionato)titanium (IV) oxide, tetrabutoxytitanium, titanium isobutoxide, tetraisopropyl orthotitanate, and zinc alkoxide compounds.

7. The method according to claim 1, wherein the layer has a thickness of 5 nm to 100 nm.

8. A method of producing an electron extraction layer comprising:
    preparing a solution in which a precursor of an inorganic compound compromising zinc (Zn) (A) and an organic compound (B) having an electron-donating group and a bonding functional group compromising silicon (Si) are mixed and dissolved,
    forming a layer by applying the solution on a cathode or a photoelectric conversion layer, and
    concurrently 1) converting the precursor of the inorganic compound (A) into the inorganic compound (A) and 2) bonding the bonding functional group of the organic compound (B) to the inorganic compound (A) after forming the layer,
    wherein a mole ratio Si/Zn in the solution is 0.05 to 0.47.

9. The method according to claim 8, wherein the bonding functional group is selected from the group consisting of an alkoxysilyl group, a chlorosilyl group, a sulfonylchloride group, a carboxy group, a phosphoric acid group and a thiol group.

10. The method according to claim 8, wherein the electron-donating group is a group selected from the group consisting of an amino group, an aromatic amino group, an alkoxy group, a thienyl group and a furanyl group.

11. The method according to claim 8, wherein the inorganic compound (A) is an inorganic oxide having n-type semiconductor characteristics.

12. The method according to claim 8, wherein the precursor of an inorganic compound (A) is a metal compound which is oxidized by heating.

13. The method according to claim 8, wherein the precursor of an inorganic compound (A) is a metal salt or metal alkoxide.

14. The method according to claim 8, wherein the precursor of an inorganic compound (A) is selected from the group consisting of zinc acetate dihydrate, zinc formate, zinc acetate, zinc propionate, zinc butyrate, zinc oxalate, zinc acetylacetonate, bis[2-(2-benzothiazolyl)phenolate]zinc, bis[2-(2-benzoxazolyl)phenolate]zinc, bis(8-quinolinolato)zinc, ammonium tetrachlorozincate, and zinc alkoxide compounds.

15. The method according to claim 8, wherein the layer has a thickness of 5 nm to 100 nm.

* * * * *